United States Patent
Shull et al.

(10) Patent No.: US 6,724,486 B1
(45) Date of Patent: Apr. 20, 2004

(54) HELIUM- NEON LASER LIGHT SOURCE GENERATING TWO HARMONICALLY RELATED, SINGLE- FREQUENCY WAVELENGTHS FOR USE IN DISPLACEMENT AND DISPERSION MEASURING INTERFEROMETRY

(75) Inventors: William A. Shull, Aptos, CA (US); Carl A. Zanoni, Middlefield, CT (US)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 09/305,808

(22) Filed: Apr. 28, 1999

(51) Int. Cl.⁷ .................................................. G01B 9/02
(52) U.S. Cl. .......................................... 356/486; 372/23
(58) Field of Search ................................ 356/484, 485, 356/486, 487, 488, 489, 490; 372/23, 21, 22

(56) References Cited

U.S. PATENT DOCUMENTS

| 3,647,302 A |   | 3/1972  | Zipin et al. |
|---|---|---|---|
| 3,987,373 A |   | 10/1976 | Mohler |
| 4,143,339 A |   | 3/1979  | Buzzard et al. |
| 4,413,342 A |   | 11/1983 | Cohen et al. |
| 4,617,666 A |   | 10/1986 | Liu |
| 4,618,957 A |   | 10/1986 | Liu |
| 4,684,828 A | * | 8/1987  | Sommargren ............... 307/425 |
| 4,948,254 A |   | 8/1990  | Ishida |
| 5,027,361 A |   | 6/1991  | Kozlovsky et al. |
| 5,091,913 A |   | 2/1992  | Zhang et al. |
| 5,179,562 A |   | 1/1993  | Marason et al. |
| 5,381,427 A |   | 1/1995  | Wedekind et al. |
| 5,404,222 A |   | 4/1995  | Lis |
| 5,467,214 A |   | 11/1995 | Heflinger et al. |
| 5,627,849 A |   | 5/1997  | Baer |
| 5,657,341 A |   | 8/1997  | Hyuga |
| 5,732,095 A |   | 3/1998  | Zorabedian |
| 5,748,313 A |   | 5/1998  | Zorabedian |
| 5,748,315 A |   | 5/1998  | Kawai et al. |
| 5,757,489 A |   | 5/1998  | Kawakami |
| 5,764,362 A |   | 6/1998  | Hill et al. |
| 5,767,971 A |   | 6/1998  | Kawai et al. |
| 5,768,304 A |   | 6/1998  | Goto |
| 5,838,485 A |   | 11/1998 | de Groot et al. |
| 6,021,141 A |   | 2/2000  | Nam et al. |
| 6,137,574 A | * | 10/2000 | Hill ............................ 356/351 |

OTHER PUBLICATIONS

"High–power cw UV at 266 nm Generated with Single–frequency Verdi," Coherent Laser Group.
"95–SHG Intracavity Doubled Argon Laser," Lexel Laser, Inc., Feb. 1999.
"Generation of 369.4 nm Second Harmonic From a Diode Laser," NASA Tech Briefs, pp. 56, 58, Jan. 1995.

(List continued on next page.)

Primary Examiner—Frank G. Font
Assistant Examiner—Andrew H. Lee
(74) Attorney, Agent, or Firm—Fish & Richardson P.C.

(57) ABSTRACT

The invention features a displacement and dispersion measuring interferometry system having a Helium-Neon laser light source. The light source can be a Helium-Neon laser that includes an intracavity doubling crystal and an intracavity etalon to generate two harmonically related, single-frequency wavelengths at sufficient powers for interferometric dispersion measurements. Alternatively, the light source can be a single-mode Helium-Neon laser that directs a single-frequency input beam into a resonant external cavity enclosing a doubling crystal to generate two harmonically related, single-frequency wavelengths at sufficient powers for interferometric dispersion measurements. In addition to dispersion measurements, the inherent wavelength stability of the Helium-Neon source permits high-accuracy displacement measurements. Thus, the Helium-Neon laser light source is sufficient for the interferometry system to simultaneously measure displacement and dispersion, and correct the displacement measurement for air-turbulence using the dispersion measurement.

46 Claims, 10 Drawing Sheets

OTHER PUBLICATIONS

Adhav, "Materials for Optical Harmonic Generation," Laser Focus, pp. 73–77, Jun. 1983.

Barnes et al., "Variation of the Refractive Index with Temperature and the Tuning Rate for KDP Isomorphs," J. Opt. Soc. Am., 72:895–898, Jul. 1982.

Baumert et al., "High–efficiency Intracavity Frequency Doubling of a Styryl–9 Dye Laser with $KNbO_3$ Crystals," Applied Optics, 24:1299–1301, May 1, 1985.

Dalton, "Glass to Metal Seals," First Symposium on the Art or Glassblowing, pp. 13–24, 1956.

Dmitriev et al., "Three– and Four–Wave (Three– and Four–Frequency) Interactions in Nonlinear Media," Handbook of Nonlinear Optical Crystals, 3–14 and 188–191.

Hercher, "Tunable Single Mode Operation of Gas Lasers Using Intracavity Tilted Etalons," Applied Optics, 8:1103–1106, Jun. 1969.

Kogelnik et al., "Astigmatically Compensated Cavities for cw Dye Lasers," IEEE Journal of Quantum Electronics, QE–8:373–379, Mar. 1972.

Kuhling et al., "Frequency Doubling within the Resonator of a Helium Neon Laser," Laser und Optoelektronik, 21:46–49, 1989 (translation attached).

Smith, "On the Optimum Geometry of a 6328A Laser," IEEE Journal of Quantum Electronics, QE–2:77–79, Apr. 1966.

Spiller, "Experimental Investigations on Gain and Maximum Output of the He–Ne Laser," Zeitschrift fur Physik, 182:487–498 (1965).

Stoleru et al., "Frequency Doubling of He–Ne Laser Radiation at 632.8 nm," Pure Appl. Opt., 5:119–124 (1996).

Adhav et al., "Guide to Efficient Doubling," Laser Focus, pp. 47–48, May 1974.

* cited by examiner

HELIUM- NEON LASER LIGHT SOURCE GENERATING TWO HARMONICALLY RELATED, SINGLE- FREQUENCY WAVELENGTHS FOR USE IN DISPLACEMENT AND DISPERSION MEASURING INTERFEROMETRY

BACKGROUND OF THE INVENTION

This invention relates to a laser light source suitable for displacement and dispersion measuring interferometers, which can be used to measure displacements of high-performance stages, e.g., reticle and/or wafer stages, in a lithographic scanner or stepper systems and integrated circuit (IC) test equipment.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object. The light source for many displacement measuring interferometers is a single-wavelength, frequency-stabilized laser, see, e.g., "Recent advances in displacement measuring interferometry" by N. Bobroff, *Measurement Science & Technology* 4, 907–926 (1993). The accuracy of the displacement measurement varies directly with the wavelength stability of the light source.

In many applications, the measurement and reference beams have orthogonal polarizations and frequencies separated by a heterodyne, split-frequency. The split-frequency can be produced, e.g., by Zeeman splitting, by acousto-optical modulation, or by positioning a birefringent element internal to the laser. A polarizing beam splitter directs the measurement beam along a measurement path contacting a reflective measurement object, directs the references beam along a reference path, and thereafter recombines the beams to form overlapping exit measurement and reference beams. The overlapping exit beams form an output beam that passes through a polarizer that mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal at the split frequency. When the measurement object is moving, e.g., by translating a reflective stage, the heterodyne signal is at a frequency equal to the split frequency plus a Doppler shift. The Doppler shift equals $2vp$, where $v$ is the relative velocity of the measurement and reference objects, $\lambda$ is the wavelength of the measurement and reference beams, and $p$ is the number of passes to the reference and measurement objects. Changes in the optical path length to the measurement object correspond to changes in the phase of the measured interference signal, with a $2\pi$ phase change substantially equal to an optical path length change $nL$ of $\lambda/p$, where $n$ is the average refractive index of the medium through which the light beams travel, e.g., air or vacuum, and where L is a round-trip distance change, e.g., the change in distance to and from a stage that includes the measurement object.

For high performance applications such as IC manufacturing the quantity of interest is the geometrical length L and not the optical path length $nL$, which is what is A measured by the displacement measuring interferometer. In particular, changes in $nL$ can be caused by changes in the refractive index $n$ rather than by geometric changes in the relative position of the measurement object. For example, in lithography applications air turbulence, particularly in the region surrounding a moving wafer or reticle stage, can cause changes in $n$. Such changes need to be determined to obtain accurate geometric displacement measurements. If not corrected, the overlay performance and yield of a lithography tool used to manufacture ICs can be seriously limited. See, e.g., "Residual errors in laser interferometry from air turbulence and non-linearity," by N. Bobroff, *Appl. Opt.* 26, 2676–2682 (1987).

Techniques based on dispersion interferometry have been used to compensate displacement measurements for air turbulence. In particular, interferometric displacement measurements are made at multiple optical wavelengths to determine the dispersion of the gas in the measurement path. The dispersion measurement can be used to convert an optical path length measured by a distance measuring interferometer into a geometric length. The conversion also requires knowledge of an intrinsic value for the refractivity of the gas. A suitable value is $\Gamma$, which is the reciprocal dispersive power of the gas for the wavelengths used in the dispersion interferometry. In general, the sensitivity of the dispersion measurement to the consequences of air-turbulence correction increases as $\Gamma$ decreases.

SUMMARY OF THE INVENTION

The invention features a displacement and dispersion measuring interferometry system having a Helium-Neon laser light source. The light source can be a Helium-Neon laser that includes an intracavity doubling crystal and an intracavity etalon to generate two harmonically related, single-frequency wavelengths at sufficient powers for interferometric dispersion measurements. Alternatively, the light source can be a single-mode Helium-Neon laser that directs a single-frequency input beam into a resonant external cavity enclosing a doubling crystal to generate two harmonically related, single-frequency wavelengths at sufficient powers for interferometric dispersion measurements. In addition to dispersion measurements, the inherent wavelength stability of the Helium-Neon source permits high-accuracy displacement measurements. Thus, the Helium-Neon laser light source is sufficient for the interferometry system to simultaneously measure displacement and dispersion, and correct the displacement measurement for air-turbulence using the dispersion measurement.

In general, in one aspect the invention features a Helium-Neon laser light source including: a Helium-Neon gain medium; a power source electrically coupled to the gain medium which during operation causes the gain medium to emit optical radiation at a first wavelength; a nonlinear optical crystal which during operation converts a portion of the optical radiation at the first wavelength into optical radiation at a second wavelength that is a harmonic of the first wavelength; an etalon; and at least two cavity mirrors enclosing the gain medium, the non-linear optical crystal, and the etalon to define a laser cavity, wherein during operation the etalon causes the cavity to lase at a single axial mode, and wherein at least one of the cavity mirrors couples the optical radiation at the first and second wavelengths into two harmonically related, single-frequency, output beams at the first and second wavelengths.

Embodiments of the laser light source can include any of the following features. A birefringent filter can be positioned within the cavity and oriented to select a particular Helium-Neon laser transition. The front and back faces of the crystal though which the optical radiation propagates can be parallel to one another to within 1 mrad. The at least two cavity mirrors can include two end mirrors and at least one fold mirror. The at least one fold mirror can have a coating that is less than 4% reflective at 3.39 microns.

Also, the laser light source can further include a detector and an intensity controller. During operation the detector measures an intensity of a portion of the output beam at the first wavelength and sends an intensity stabilization signal to the intensity controller indicative of the intensity of the output beam at the first wavelength. The intensity controller causes the power source to adjust current flow through the gain medium based on the intensity stabilization signal.

Furthermore, the laser light source can include different embodiments for the Helium-Neon light source. For example, the Helium-Neon gain medium can include a vacuum tube filled with Helium and Neon gases, the tube having opposite ends with a Brewster window at one end and a bellows hermetically sealing the other end to one the cavity mirrors. Also, the Helium-Neon gain medium can include multiple vacuum tubes each filled with Helium and Neon gases and multiple fold mirrors folding the multiple tubes into the laser cavity. Furthermore, the Helium-Neon gain medium can include an enclosure of Helium and Neon gases, the enclosure having an elongate cross-section and being surrounded at opposite ends by mirrors that define multiple passes through the enclosure within the laser cavity.

In general, in another aspect, the invention features a Helium-Neon laser light source including: a single-mode Helium-Neon laser which during operation generates a single-frequency input beam at a first wavelength; a non-linear optical crystal external to the laser which during operation converts a portion of the input beam at the first wavelength into optical radiation at a second wavelength that is a harmonic of the first wavelength; and a plurality of mirrors enclosing the nonlinear crystal to define a resonant external cavity, wherein one of the mirrors couples optical radiation at the first wavelength from the input beam into the external cavity and another one of the mirrors couples optical radiation at the first and second wavelengths out of the external cavity to produce two harmonically related, single-frequency, output beams at the first and second wavelengths.

Embodiments of either of the Helium-Neon laser light sources described above can include any of the following features. The two harmonically related, single-frequency, output beams can be coextensive. The intensity of each output beam can be greater than about 0.5 mW. The laser light sources can further include a transducer coupled to one of the cavity mirrors and a wavelength controller. During operation the wavelength controller causes the transducer to adjust the cavity length of the laser cavity or extra cavity, respectively, based on a wavelength stabilization signal derived from one of the output beams. For the laser cavity, for example, the wavelength stabilization signal can be generated by comparing the output frequency to the frequency produced by reference laser or a temperature-controlled Fabry-Perot cavity, or by analyzing the transmission of the output beam through a gas absorption cell having well-established absorption spectra. Alternatively, for the laser source having the external cavity, the cavity-length controller can cause the transducer to adjust the cavity length based on an error signal derived from input beam light not coupled into the external cavity.

Also, the laser light sources can her include first and second acousto-optical modulation systems positioned external to, the laser cavity or external cavity, respectively. During operation the first modulation system generates a frequency splitting between orthogonal polarization components of the output beam at the first wavelength and the second modulation system generates a frequency splitting between orthogonal polarization components of the output beam at the second wavelength.

Furthermore, the laser light sources can further include a heating element thermally coupled to the crystal and a temperature controller that causes the heating element to maintain a crystal temperature suitable for non-critical phase matching of the optical radiation at the first and second wavelengths. The non-linear optical crystal can have an optic axis oriented substantially perpendicular to the propagation direction of the optical radiation within the crystal. For example, the nonlinear optical crystal can be Rubidium Dihydrogen Phosphate (RDP). Alternatively, the nonlinear crystal can be oriented for critical phase matching of the optical radiation at the first and second wavelengths and can be, e.g., one of Lithium Triborate (LBO), Beta-Barium Borate (BBO), or Lithium Iodate ($LiIO_3$).

In another aspect, the invention features an interferometry system including either of the Helium-Neon laser light sources described above and a dispersion interferometer, which during operation measures dispersion along a path to a measurement object using light derived from the two output beams.

In yet another aspect, the inventions features an interferometry system including either of the Helium-Neon laser light sources described above, an interferometer, and an optical analysis system. During operation the interferometer directs first and second measurement beams along a common path contacting a reflective measurement object, and combines the reflected first measurement beam with a first reference beam to form a first exit beam and the reflected second measurement beam with a second reference beam to form a second exit beam. The first measurement and reference beams are derived from the output beam from the laser light source having the first wavelength and the second measurement and reference beans are derived from the output beam from the laser light source having the second wavelength. The first and second exit beams are indicative of changes in the optical path length to the measurement object at the first and second wavelengths. During operation, the optical analysis system determines changes in the geometric path length to the measurement object based on the first and second exit beams.

In general, in yet another aspect, the invention features an interferometry system including: a Helium-Neon laser light source that generates two harmonically related, single-frequency output beams; and a dispersion interferometer which during operation measures dispersion along a path to a measurement object using light derived from the two output beams.

In general, in yet another aspect, the invention features an interferometry system including: a Helium-Neon laser light source that generates two harmonically related, single-frequency output beams; an interferometer; and an optical analysis system. During operation, the interferometer directs first and second measurement beams along a common path contacting a reflective measurement object, and combines the reflected first measurement beam with a first reference beam to form a first exit beam and the reflected second measurement beam with a second reference beam to form a second exit beam. The first measurement and reference beams are derived from the output beam from the laser light source having the first wavelength and the second measurement and reference beams are derived from the output beam from the laser light source having the second wavelength. The first and second exit beams are indicative of changes in the optical path length to the measurement object at the first and second wavelengths. During operation, the optical analysis system determines changes in the geometric path length to the measurement object based on the first and second exit beams.

In another aspect, the invention features a lithography system for use in fabricating integrated circuits on a wafer. The system includes: a stage for supporting the wafer, an illumination system for imaging spatially patterned radiation onto the wafer, a positioning system for adjusting the position of the stage relative to the imaged radiation; and at least one of the interferometry systems described above for measuring the position of the stage.

In yet another aspect, the invention features a lithography system for use in fabricating integrated circuits on a wafer. The system includes: a stage for supporting the wafer, and an illumination system including a radiation source, a mask, a positioning system, a lens assembly, and at least one of the interferometry systems described above. During operation, the source directs radiation through the mask to produce spatially patterned radiation, the positioning system adjusts the position of the mask relative to the radiation from the source, the lens assembly images the spatially patterned radiation onto the wafer, and the interferometry system measures the position of the mask relative to the radiation from the source.

In yet another aspect, the invention features a lithography system for fabricating integrated circuits including first and second components and at least one of the interferometry systems described above. The first and second components are movable relative to each other. The first component includes the measurement object, and the interferometry system measures the position of the first component relative to the second component.

In yet another aspect, the invention features a lithography system for fabricating integrated circuits including first and second components, and at least one of the interferometry systems described above. The first and second components are movable relative to each other. The first component includes the measurement object, the reference beams contact the second component prior to forming the exit beams, and the interferometry system measures the relative position of the first and second components.

In yet another aspect, the invention features a beam writing system for use in fabricating a lithography mask. The system includes: a source providing a write beam to pattern a substrate; a stage supporting the substrate; a beam directing assembly for delivering the write beam to the substrate; a positioning system for positioning the stage and beam directing assembly relative one another, and at least one of the interferometry systems described above for measuring the position of the stage relative to the beam directing assembly.

In general, in another aspect, the invention features an interferometry method including: providing two harmonically related, single-frequency output beams from a Helium-Neon laser light source; and measuring dispersion along a path to a measurement object using light derived from the two output beams.

In general, in yet another aspect, the invention features an interferometry method including: providing two harmoni-cally related, single-frequency output beams from a Helium-Neon laser light source; and interferometrically measuring changes in a geometric path length to a measurement object using light derived from the two output beams.

In another aspect, the invention features a lithography method for use in fabricating integrated circuits on a wafer. The lithography method includes: supporting the wafer on a moveable stage; imaging spatially patterned radiation onto the wafer, adjusting the position of the stage; and measuring the position of the stage using any of the interferometry methods described above.

In yet another aspect, the invention features a lithography method for use in the fabrication of integrated circuits. The lithography method includes: directing input radiation through a mask to produce spatially patterned radiation; positioning the mask relative to the input radiation; measuring the position of the mask relative to the input radiation using any of the interferometry methods described above, wherein one of a stage supporting the mask and a illumination system providing the input radiation includes the measurement object; and imaging the spatially patterned radiation onto a wafer.

In yet another aspect, the invention features a lithography method for fabricating integrated circuits on a wafer including: positioning a first component of a lithography system relative to a second component of a lithography system to expose the wafer to spatially patterned radiation; and measuring the position of the first component relative to the second component using any of the interferometry methods described above, wherein the first component includes the measurement object.

In yet another aspect, the invention features a beam writing method for use in fabricating a lithography mask. The method includes: directing a write beam to a substrate to pattern the substrate; positioning the substrate relative to the write beam; and measuring the position of the substrate relative to the write beam using any of the interferometry methods described above.

The invention has many advantages. The Helium-Neon laser light source generates two harmonically related, single-frequency wavelengths (632.8 nm and 316.4 nm) at powers sufficient for dispersion interferometry, e.g., output powers greater than 1 mW. The intracavity etalon causes the laser to operate in a single axial mode to thereby generate the single-frequency wavelengths. In addition because the Helium-Neon gain medium has a relatively narrow emission curve (about 1.5 GHz at 632.8 nm), the wavelength stability of the single-frequency wavelengths is excellent (about 3 parts in $10^6$). Routine feedback control of the laser cavity length can further enhance the wavelength stability to better than 1 part in $10^9$. Moreover, the Helium-Neon light source is compact, robust, and long-lived relative to many lasers with other gain media.

Furthermore, in embodiments for which the doubling crystal is non-critically phase matched by temperature tuning, there is no lateral walk-off between the fundamental and frequency-doubled beams. As a result, the laser light source output beams can have substantially circular transverse profiles, and the doubling crystal can be longer, thereby enhancing conversion efficiency. In addition, for either critically or non-critically phase-matched embodiments, an additional control system can modulate the current intensity to the Helium-Neon discharge tube based on the intensity of the fundamental output beam to independently stabilize the intensity of the fundamental output beam. Moreover, embodiments in which multiple Helium- Neon gas tubes are folded into the cavity or in which the cavity defines multiple passes within a Helium-Neon gas slab both increase the compactness of the laser and its intensity output. Also, some embodiments produce multiple pairs of harmonically related, single-frequency output beams thereby increasing the overall power generated by the light source.

The properties of the Helium-Neon laser light source can be exploited in a displacement and dispersion measuring interferometry system. The two high-stability, harmonically related, single-frequency wavelengths permit the interferometry system to simultaneously measure displacement and dispersion using the Helium-Neon laser light source as the only light source. The dispersion measurement can be used to correct the displacement measurement for air turbulence. In addition, the wavelengths provided by the laser (632.8 nm and 316.4 nm) are especially useful for the dispersion measurement because they correspond to a relatively low value for the reciprocal dispersive power $\Gamma$ as compared with other wavelengths such as those from the fundamental and doubled output of a frequency-doubled Nd:YAG laser (1064 nm and 532 nm). In particular, $\Gamma$ equals about 21.4 for the Helium-Neon laser wavelengths and $\Gamma$ equals about 64.7 for Nd:YAG laser wavelengths. As mentioned above, the sensitivity of the dispersion measurement increases inversely with $\Gamma$. Furthermore, the Helium-Neon wavelengths are in range (greater than about 300 nm) where suitable optical components and coatings can be fabricated inexpensively. Moreover, in embodiments for which the doubling crystal is non-critically phase-matched by temperature tuning, the symmetrical spatial profiles of the fundamental and frequency-doubled output beams reduce phase front errors in the interferometry measurements.

More generally, because the interferometry system can measure both dispersion and displacement using the Helium Neon laser light source as the only light source, the interferometry system is simple and compact. In particular, no additional light sources are necessary. Moreover, because the dispersion and displacement measurements are made using only two wavelengths, suitable coatings for the interferometer optics can be more easily obtained.

Nonetheless, in other embodiments, the interferometry systems can include an additional light source such as a separate Helium-Neon, Argon, or diode laser producing a single-frequency beam at only a single wavelength. In such cases, the Helium-Neon laser light source described above only provides light for interferometric dispersion measurements, and the additional light source provides light for interferometric displacement measurements.

Because the displacement and distance measuring interferometry systems provide high-accuracy position measurements corrected for air turbulence, they can be incorporated into lithography tools used to fabricate integrated circuits (ICs). The robustness and long life of the Helium-Neon source in the interferometry systems make the systems especially suitable for the demands of IC fabrication.

Other features, aspects, and advantages of the invention follow.

BRIEF DESCRIPTION OF THE DRAWING

FIG. 4a is a schematic of the optical arrangement for the system and FIG. 4b is a schematic of an electronic circuit in the system.

FIGS. 5a, 5b, and 5c relate lithographic applications that fabricate integrated circuits using the interferometry system of FIG. 4a. FIG. 5a is a schematic diagram of a lithographic tool and FIGS. 5b and 5c are flow charts showing steps for fabricating integrated circuits.

FIG. 6 is a schematic diagram of a beam writing system using the interferometry system of FIG. 4a.

DETAILED DESCRIPTION

The invention features a Helium-Neon laser light source that generates two harmonically related, single-frequency output beams for use in displacement and dispersion measuring interferometry.

Figure 1:
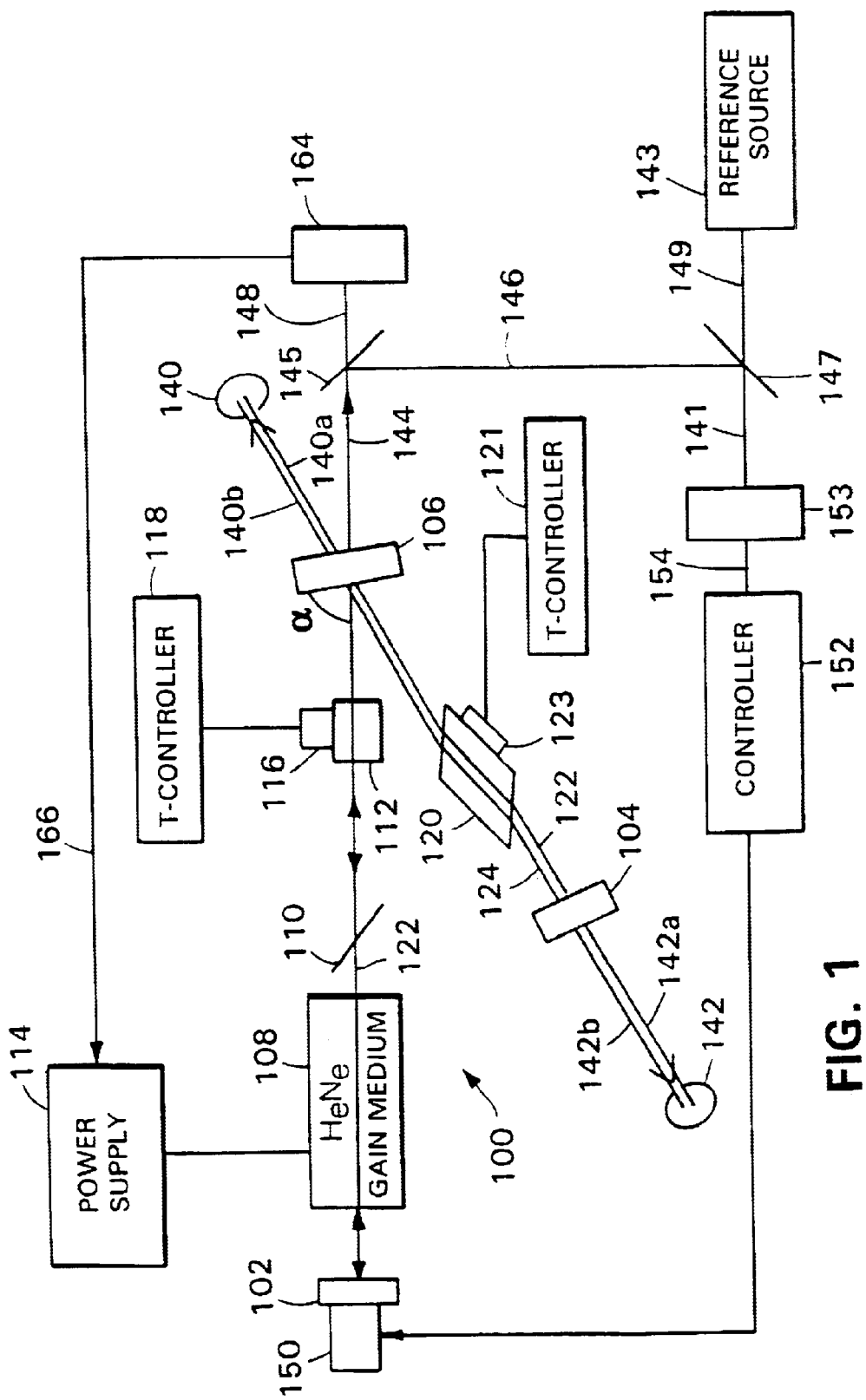
FIG. 1 is a schematic diagram of a Helium-Neon laser light source that generates two harmonically related, single-frequency output beams. The light source is based on an intracavity-doubled laser operating at a single axial mode.

One embodiment of the Helium-Neon laser light source is an intracavity-doubled laser 100, as shown in FIG. 1. Laser 100 includes cavity-end mirrors 102 and 104 and cavity-fold mirror 106 to define a resonant optical cavity. Mirrors 102 and 106 enclose Helium-Neon gain medium 108, birefringent filter 110, and etalon 112, and mirrors 106 and 104 enclose a nonlinear crystal 120. A power supply 114 is electrically coupled to Helium-Neon gain medium 108 and causes gain medium 108 to emit optical radiation into the optical cavity. Birefringent filter 110 is oriented to select a particular Helium-Neon laser transition such as 632.8 nm, and etalon 112 is oriented to minimize loss for a single axial mode within that laser transition. As a result, the optical cavity causes a single axial mode to lase within the cavity to produce a single-frequency, fundamental beam 122 at 632.8 nm. Nonlinear crystal 120 frequency-doubles fundamental beam 122 within the cavity to produce a single-frequency, harmonic beam 124 at 316.4 nm. Beams 122 and 124 are coextensive with one another, however, FIG. 1 illustrates them as separate from one another for clarity.

End minor 102 is made from a glass substrate such as BK-7 and includes a laser reflecting surface polished and coated with a low-loss, multi-layer dielectric coating having a reflectivity of greater than about 99.9% at 632.8 nm and a minimum reflectivity at 3.39 microns. The minimum reflectivity at 3.39 microns prevents stimulated Helium-Neon laser emissions in the infrared from competing with the lasing of fundamental beam 122. End mirror 104 and fold mirror 106 are fabricated from glass substrates that transmit ultraviolet light, such as fused silica Mirrors 104 and 106 are each coated with a low-loss, multi-layer dielectric coating having a reflectivity of greater than about 99.9% at 633 nm and a transmission at 316.5 nm of greater than about 85% (e.g., 93%). The leakage of fundamental beam 122 and the transmission of harmonic beam 124 through mirror 106 form a first pair 140 of coextensive, harmonically related, single-frequency output beams 140a and 140b. Similarly, the leakage of fundamental beam 122 and the transmission of harmonic beam 124 through mirror 104 form a second pair 142 of coextensive, harmonically related, single-frequency output beams 142a and 142b.

The placement and curvature of mirrors 102, 104, and 106 are selected to cause fundamental beam 122 to pass through the discharge bore of Helium-Neon gain medium 108 with a minimal diffraction loss (e.g., on the order of a few tenths of a percent) and to produce a beam waist in nonlinear crystal 120 having a diameter in the range of about 10 to 200 microns. The minimal diffraction loss produces a $TEM_{00}$ spatial mode for fundamental beam 122 (with a similar spatial mode for output beams 140a, 140b, 142a, and 142b), and positioning the beam waist in the nonlinear optical crystal enhances conversion efficiency from fundamental beam 122 to harmonic beam 124. In the presently described embodiment, the total optical cavity length is about 1 m, the discharge bore diameter is about 2 mm, and the radii of curvature for mirrors 102, 104, and 106 are 200 cm, 10 cm, and 20 cm, respectively. The distance between mirrors 104 and 106 is about 14 cm and the angle α in the beam path formed by fold mirror 106 is 15°. In general, the angle α is adjusted to compensate for astigmatism introduced by the nonlinear crystal 120. See, e.g., H. W. Kogelnik et al. "Asthmatically Compensated Cavities for CW Dye Lasers" in IEEE J. Quan. Elec., QE-8:373–379, 1972. In other embodiments, the optical cavity can be formed with mirrors having different positions and curvatures, and more generally, the cavity can be formed with two or more mirrors. For example, the laser cavity can be linear with two end mirrors and one or more intermediate focusing optics to produce a suitable spatial mode structure in the cavity.

Birefringent filter 110 is oriented to preserve the linear polarization of fundamental beam 122 and introduce an elliptical polarization component to light at other wavelengths that pass through the filter. Filter 110 is made from a material such as polished crystal quartz and is on the order of 0.5 mm thick. In addition, filter 110 is oriented so that fundamental beam 122 contacts it at Brewster's angle to minimize reflection losses.

Etalon 112 is a Fabry-Perot etalon fabricated from a low loss material such as fused quartz (e.g., Dynasil™ or Suprasil™) and is 7 to 30 mm thick depending on the cavity mode separation. The end faces of etalon 112 are parallel to approximately 2 seconds of arc. Etalon 112 minimizes loss for one axial mode within the Helium-Neon transition selected by filter 110 relative to adjacent axial modes to cause the cavity to lase at only that one axial mode. In the presently described embodiment, round trip transmission loss for a 12 mm thick, fused-quartz etalon is 0.1% for the selected axial mode and 0.3% for the adjacent axial modes. The difference is sufficient to cause single-mode operation. A heating element 116 is thermally coupled to etalon 112 and controlled by a temperature controller 118 to maintain etalon 112 at a constant temperature and thereby stabilize its optical thickness.

A piezoelectric transducer 150 is mechanically coupled to end mirror 102 to stabilize the optical cavity length in laser 100 and thereby stabilize the wavelength of fundamental beam 122. A wavelength-stability controller 152 causes transducer 150 to adjust the cavity length based on an error signal derived from an output beam at the fundamental wavelength. In the presently described embodiment, leakage of fundamental beam 122 through fold mirror 106 provides an additional output beam 144, which is split by beam splitter 145 into beams 146 and 148. A second beam splitter 147 combines beam 146 with an output bean 149 from a frequency-stabilized laser source 143 to produce a reference beam 141 whose time-varying intensity is measured by detector 153 to determine a beat frequency between beams 146 and 149. Detector 153 sends a signal 154 to controller 152 indicative of the beat frequency. Based on the deviation of signal 154 from a selected beat frequency, controller 152 causes transducer 150 to adjust the cavity length of laser 100 to minimize that deviation. In other embodiments, controller 152 can cause transducer 150 to adjust the cavity length based on other types of error signals. For example, rather than comparing the output frequency at the fundamental wavelength to a frequency-stabilized source, the error signal can be generated by comparing the output frequency to the frequency produced by temperature-controlled Fabry-Perot cavity or by analyzing the transmission of the output beam through a gas absorption cell having well-established absorption spectra For example, see T. Ikegami et al., *Frequency Stabilization of Semiconductor Laser Diodes*, (Artech House, Norword MA, 1995). Stabilizing the frequency of fundamental beam 122 also stabilizes the frequency of harmonic beam 124.

A second detector 164 measures the intensity of beam 148 to produce a second error signal 166 indicative of the intensity. Error signal 166 is sent to power supply 114, which adjusts the electrical current to gain medium 108 based on the deviation of error signal 166 from a preset level. As a result, error signal 166 causes power supply 114 to stabilize the intensity of fundamental beam 122, which also minimizes intensity fluctuations in harmonic beam 124 caused by variations in fundamental power to nonlinear crystal 120. In other embodiments, the electrical current to gain medium 108 can be based on an error signal derived from the intensity of an output beam at the harmonic wavelength.

Nonlinear crystal 120 converts a portion of fundamental beam 122 at 632.8 nm into harmonic beam 124 at 316.4 mm. Nonlinear crystal 120 has the following properties: low insertion loss at the wavelength of the fundamental beam 122; refractive properties suitable for phase matching fundamental and harmonic beams 122 and 124; and low absorption at the wavelength of harmonic beam 124. Preferably, crystal 120 is also commercially available and polishable. Suitable crystals include Rubidium Dihydrogen Phosphate (RDP), Lithium Triborate (LBO), Beta-Barium Borate (BBO), or Lithium Iodate ($LiIO_3$). In the presently described embodiment, nonlinear crystal 120 is oriented for Type I phase matching, which means that fundamental and harmonic beams 122 and 124 have orthogonal polarizations. In other embodiments, Type II phase matching can be employed in which beams 122 and 124 have the same polarizations. The faces of nonlinear crystal 120 are cut at Brewster's angle relative to fundamental beam 122 to prevent reflection losses. The Type I phase matching can be achieved by angle tuning, i.e., critical phase matching, or temperature tuning, i.e., non-critical phase matching. Angle tuning involves orienting the nonlinear crystal so that its optic axis forms a non-normal angle with the incident fundamental beam that causes the generated harmonic beam to remain in-phase with the fundamental beam as they propagate through the crystal. Temperature tuning involves orienting the optic axis of the nonlinear crystal to be normal with the propagation direction of the fundamental and harmonic beams and maintaining the temperature of the crystal at a temperature where the refractive indices within the crystal for the orthogonally polarized fundamental and harmonic beams are equal. For a general reference on phase matching in nonlinear crystals, see, e.g., V. G. Dmitriev et al., *Handbook of Nonlinear Optical Crystals*, (Springer Publishing, 1997).

In the presently described embodiment, nonlinear crystal 120 is a temperature-tuned RDP crystal, which is oriented such that the electric field vector of fundamental beam 122 is parallel to the ordinary plane of crystal 120 and the electric field vector of harmonic beam 124 is parallel to the extraordinary axis of crystal 120. A temperature controller 121 causes a heating element 123 that is thermally coupled to nonlinear crystal 120 to maintain a constant temperature of about 51.5 degrees centigrade to phase match fundamental and harmonic beams 122 and 124. At this temperature $n_2^e$ equals $n_1^o$, where $n_2^e$ is the refractive index for beam 124 at 316.4 nm and $n_1^o$ is the refractive index for beam 122 at 632.8 nm. Because fundamental beam 122 propagates through crystal 120 perpendicular to the crystal's extraordinary axis, harmonic beam 124 is produced with a propagation direction coextensive and collinear with fundamental beam 122. Thus, there is no lateral walk off between beams 122 and 124 and the beams will have similar transverse spatial profiles, e.g., symmetric $TEM_{00}$ modes. In addition, because there is no lateral walk off crystal 120 can be relatively long to increase conversion from fundamental beam 122 to harmonic beam 124. In the presently described embodiment, nonlinear crystal 120 is 25 mm long.

In addition, the faces of nonlinear crystal 120 are polished and cut parallel to one another to less than about 5 minutes of arc. Applicants have observed that the parallel-faced crystal improves single-mode operation in laser 100 by functioning as a second etalon. For such operation the end faces of crystal 120 can be at Brewsters angle or at normal incidence to fundamental beam 122.

Figure 2A:
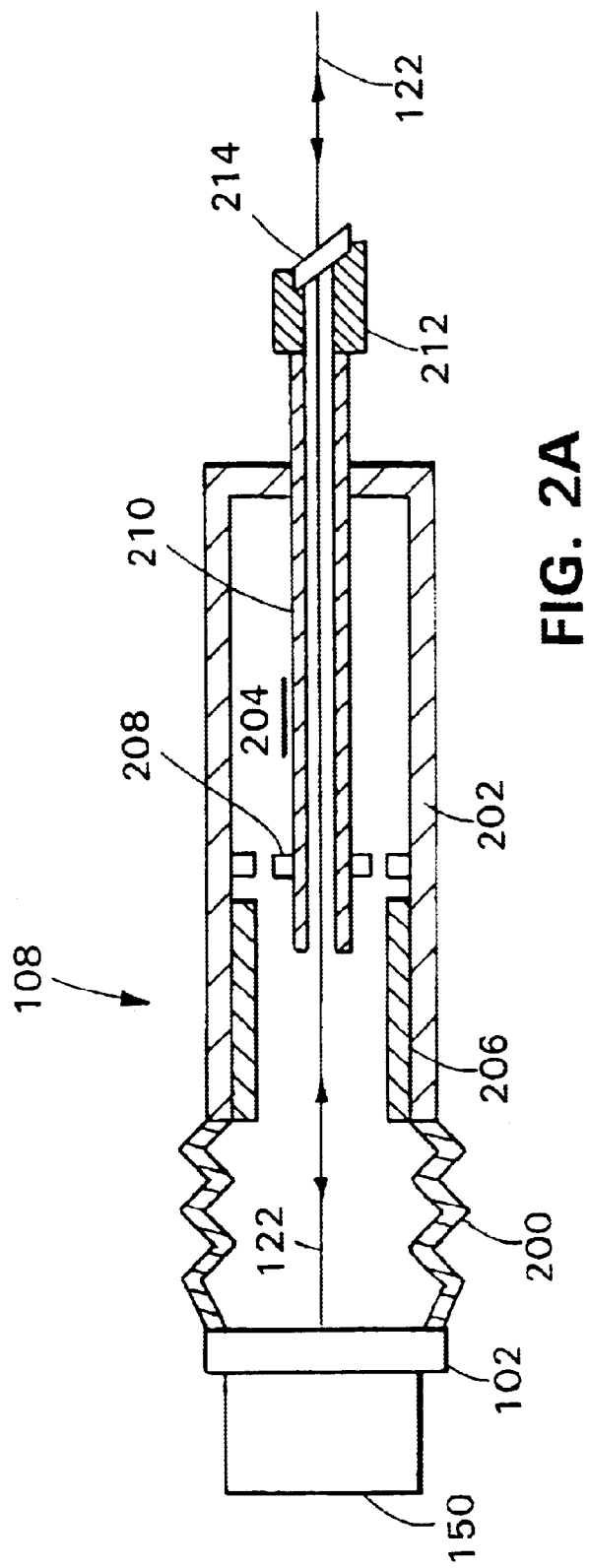
FIGS. 2a, 2b, 2c and 2d are diagrams of embodiments for the Helium-Neon gain medium of the laser in FIG. 1.

Helium-Neon gain medium 108 can be any conventional Helium-Neon laser tube. FIG. 2a is a cross-sectional diagram of the Helium-Neon laser tube used in the presently described embodiment. Although not depicted in FIG. 1, a metallic bellows 200 connects end mirror 102 to a glass vacuum tube 202 filled with a 9:1 mixture of $^3$Helium to $^{20}$Neon gas 204 at a total pressure of between 1.00 and 3.50 Torr. Adjacent bellows 200 the inner surface of tube 200 is coated with an aluminum film to form a first electrode 206 electrically connected to power supply 114. A perforated disk (known in the art as a "spider") 208 supports a glass capillary tube 210 within vacuum tube 202. Capillary tube 210 has an inner diameter of 2 mm, which defines the bore diameter of gain medium 108, and extends to cylindrically shaped second electrode 212 that is sealed to a glass Brewster window 214 to maximize transmission of fundamental beam 122 through gain medium 108. During operation, the path between electrodes 206 and 212 defines a current path that causes optical emission from gas 204. The path through capillary tube 210 connecting end mirror 102 and Brewster window 214 defines the laser beam path for fundamental beam 122. For the presently described embodiment, an output of 30 W by power supply 114 to gain medium 108 causes laser 100 to produce about 1–2 mW in each of beams 140a, 140b, 142a, and 142b.

Figure 2B:
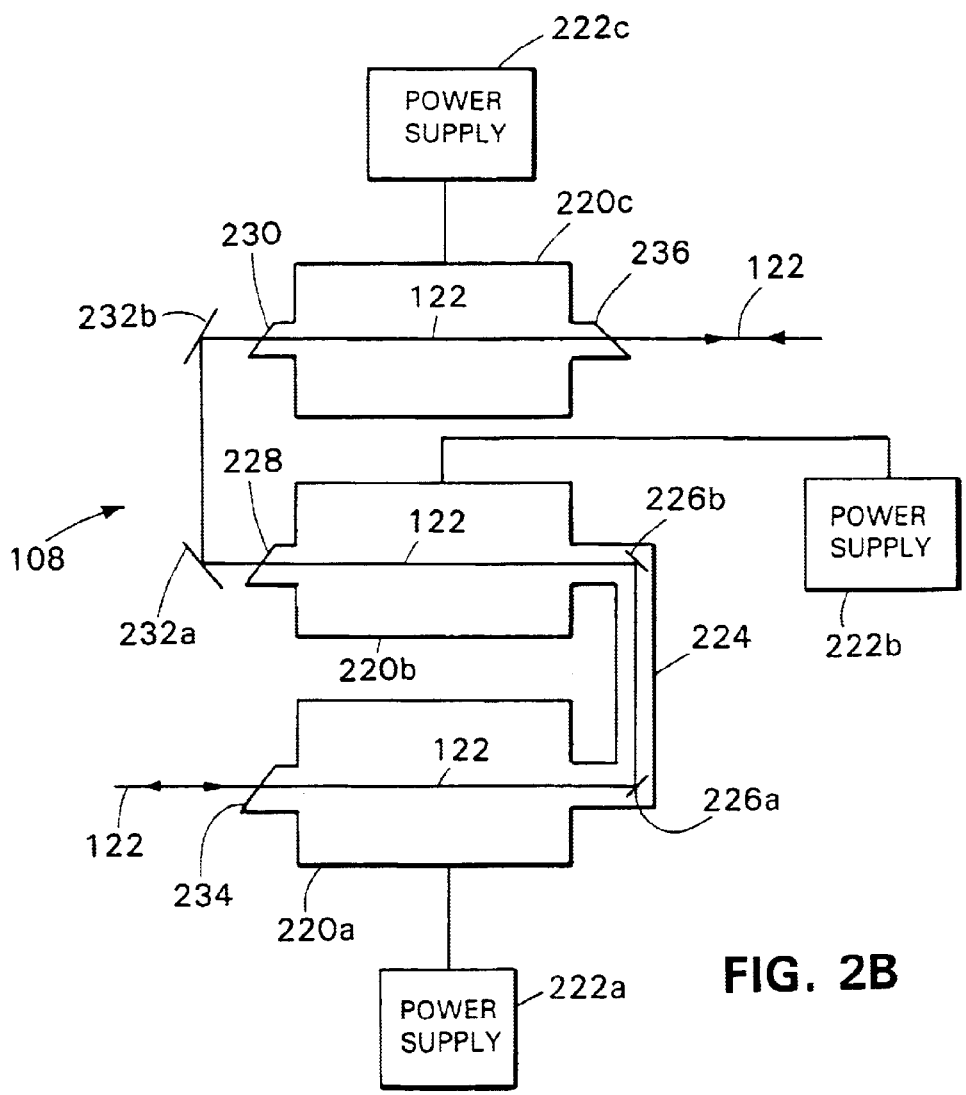

In other embodiments of laser 100, gain medium 108 can include multiple Helium-Neon gas tubes 220a, 220b, and 220c as shown in FIG. 2b. Each tube includes electrodes electrically coupled to respective power supplies 222a, 222b, and 222c. The gas tubes can be connected to one another as shown with tubes 220a and 220b, or sealed from one another as shown with tubes 220b and 220c. In particular, a U-shaped tube 224 connects the inner capillary tubes of gas tubes 220a and 220b so that Helium-Neon gas can flow between them. U-shaped tube 224 includes internal reflective surfaces 226a and 226b to fold the laser beam path from tube 220a to tube 220b. In contrast, tubes 220b and 220c are sealed from each another by Brewster windows 228 and 230, and external mirrors 232a and 232b fold the laser beam path from tube 220b to tube 220c. Additional Brewster windows 234 and 236 on tubes 220a and 220c, respectively, transmit fundamental beam 122 to the other parts (not shown) of the laser cavity. Multiple Helium-Neon tubes can increase the energy in fundamental beam 122 while folding the cavity to keep laser 100 compact.

Figure 2C:
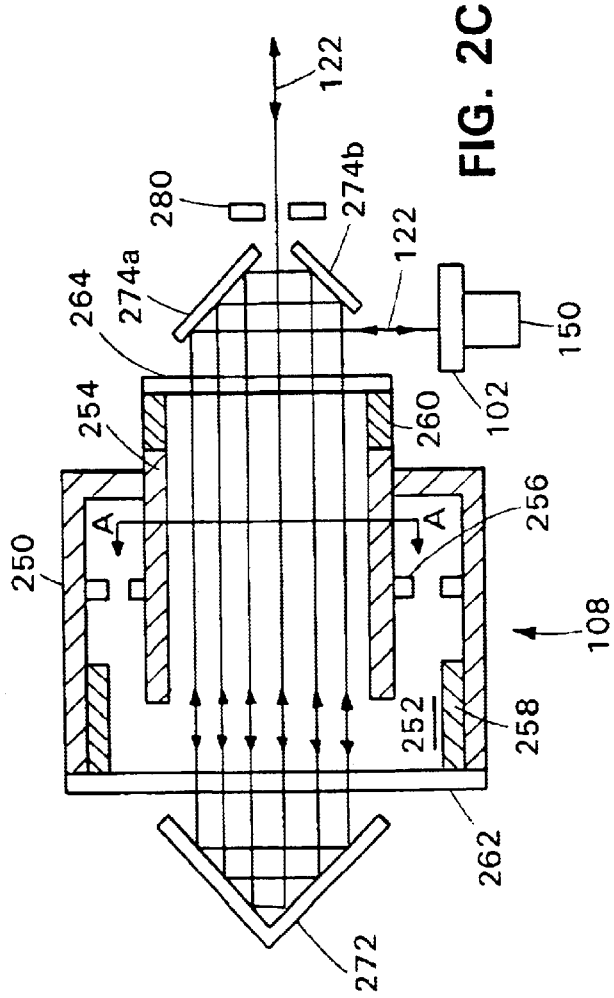
Figure 2D:
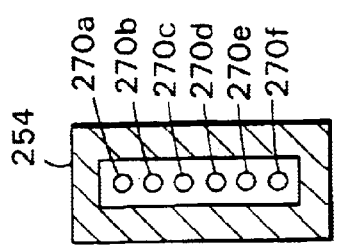

In further embodiments of laser 100, the cavity can include additional optics to define multiple passes of fundamental beam 122 through gain medium 108 as shown in cross-sectional diagram FIG. 2c. In this embodiment, gain medium 108 includes an outer glass structure 250 enclosing Helium-Neon gas 252, and a hollow slab-shaped capillary structure 254 supported within outer glass structure 250 by spider 256. One end of glass structure 250 has an aluminum coating on its inner surface to form a first electrode 258, and at the opposite end, capillary structure 254 extends outside of structure 250 and seals to a hollow second electrode 260. Antireflection-coated windows 262 and 264 are located at the opposite ends to seal the Helium-Neon gas within gain medium 108. Electrodes 258 and 260 are electrically coupled to power supply 114 (not shown) and define a current path that causes optical emission from gas 252. Capillary structure 254 has an elongate cross-section to accommodate multiple, parallel beam passes 270a–f through structure 254 as shown in FIG. 2d, which is a cross-sectional diagram of FIG. 2c along the axis A—A.

Returning again to FIG. 2c, the cavity further includes roof mirror 272 and mirrors 274a and 274b, which surround the opposite ends of gain medium 108. Unlike what is depicted in FIG. 1, cavity end mirror 102 is positioned to the side of gain medium 108 in this embodiment. Starting from end mirror 102, fundamental beam 122 travels to mirror 274a and thereafter traces a spiral path through gain medium 108, ultimately emerging between mirrors 274a and 274b, where upon the beam travels to the remaining cavity optics described above with reference to FIG. 1. Although FIG. 2c depicts six passes of fundamental beam 122 through gain medium 108, other embodiments can include more or less than six passes. Because capillary structure 254 confines the transverse profile of fundamental beam 122 along only a single dimension, the cavity further includes an aperture 280 having a diameter of, e.g., 2 mm, which causes fundamental beam 122 to lase with a symmetric $TEM_{00}$ spatial mode.

The spiral path defined by the additional mirrors and including the multiple passes through gain medium 108 increases the energy extracted by fundamental beam 122 from gas 252 while providing a compact, folded geometry. In particular, the parallel multiple passes through gain medium 108 produced by the additional mirrors optimally fill the electrically excited volume of gas 252. In another embodiment, windows 262 and 264 do not have an antireflection coating and instead are oriented at Brewster's angle with respect to beam 122 to minimize reflection losses. In a further embodiment, roof mirror 272 can replace window 262 by being connected directly to glass structure 250 to seal that end of the gain medium. In addition, mirrors 274a and 274b can include an antireflection-coated window sealing the opening between them, and the resulting structure can replace window 264 by being connected directly to electrode 260 to seal the opposite end the gain medium. Other embodiments can also include different positions for electrodes 258 and 260 and different shapes for glass structure 250 and capillary structure 254.

Figure 3:
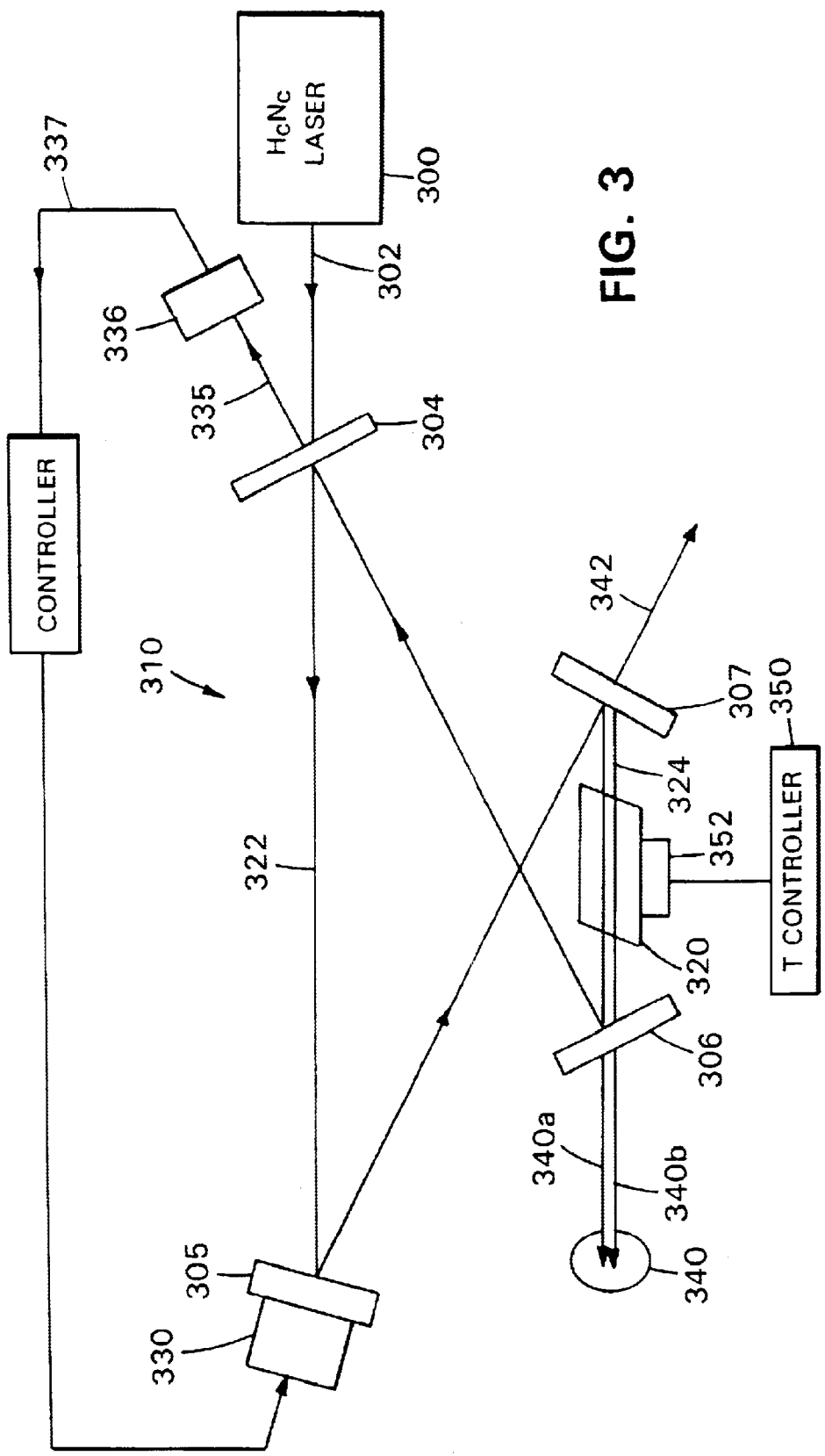
FIG. 3 is a schematic diagram of another Helium-Neon laser light source that generates two harmonically related, single-frequency output beams. The light source is based on a single-mode Helium-Neon pumping a resonant external cavity having a doubling crystal.

In another embodiment of the Helium-Neon laser light source illustrated in FIG. 3, a Helium-Neon laser directs a single-frequency input beam into a resonant external cavity enclosing a doubling crystal to generate two harmonically related, single-frequency wavelengths at sufficient powers for interferometric dispersion measurements.

Referring to FIG. 3, Helium-Neon laser 300 produces a single-frequency, input beam 302 at a wavelength of 632.8 nm (the fundamental wavelength). Laser 300 can be similar to the one described above with reference to FIG. 1 except that there is no intracavity nonlinear crystal, nor cavity mirrors accommodating the intracavity nonlinear crystal. In particular, laser 300 can include, an etalon that causes the laser to operate at a single axial mode, an actively stabilized cavity length to stabilize the wavelength of single-frequency beam 302, and an actively stabilize power supply to the Helium-Neon gain medium to stabilize the intensity of input beam 302.

Input beam 302 is incident on a coupling mirror 304, which is one of a plurality of mirrors that define an external cavity 310 enclosing a nonlinear crystal 320. Optical radiation from input beam 302 forms a fundamental beam 322 at a wavelength of 632.8 nm that resonates within external cavity 310. The curvature of the mirrors forming external cavity 310 cause fundamental beam 322 to have a transverse diameter in the range of about 10 to 200 microns in nonlinear crystal 320. Nonlinear crystal 320 frequency doubles a portion of fundamental beam 322 into harmonic beam 324, which has a single-frequency wavelength of 316.4 nm. At least one of the mirrors that form external cavity 310 couples fundamental and harmonic beams 322 and 324 into a pair 340 of coextensive, harmonically related, single-frequency output beams 340a and 340b at 632.8 nm and 316.4 nm, respectively. Depending on the optics that form cavity 310, fundamental beam 322 can propagate in a single direction, whereby cavity 310 forms a ring cavity, or fundamental beam 322 can form a standing wave within the cavity, such as in a linear external cavity. Such resonant external doubling cavities are known in the art, see, e.g., Kozlovsky et al. in U.S. Pat. No. 5,027,361, the contents of which are incorporated herein by reference.

In the presently described embodiment, external cavity 310 is a ring cavity formed by four cavity mirrors, coupling mirror 304 and additional mirrors 305, 306, and 307. Mirrors 306 and 307 enclose nonlinear crystal 320. Each of mirrors 305, 306, and 307 have a coating that is highly reflective at 632.8 nm, e.g., a reflectivity greater than about 99.9%. Mirror 307 is also highly transmissive at 316.4 nm, e.g., a reflectivity of less than about 10%. Output beams 340a and 340b emerge through mirror 307 with energies each greater than about 1 mW. As described in Kozlovsky et al., ibid, the reflectivity of coupling mirror 304 at 632.8 nm is impedance matched to losses in external cavity 310, thereby optimizing coupling of optical radiation from input beam 302 into cavity 310. Leakage of fundamental beam 322 through mirror 306 produces an additional single-frequency output beam 342 at 632.8 nm. Other embodiments could include external cavities with mirrors having different properties and with more or less than four cavity mirrors.

As in the embodiment of FIG. 1, nonlinear crystal 320 is an RDP crystal that is oriented with its optic axis perpendicular to the propagation direction of fundamental beam 322. A temperature controller 350 causes a heating element 352 thermally connected to crystal 320 to maintain a crystal temperature of about 51.5 degrees centigrade to phase match fundamental and harmonic beams 322 and 324. As described above, in other embodiments either Type I or Type II phase matching can be employed. Furthermore, for Type I phase matching, the nonlinear crystal can be angle tuned rather than temperature tuned. In particular, in angle-tuned embodiments suitable materials for nonlinear crystal 320 include LBO, BBO, and $LiIO_3$.

A transducer 330 is mechanically connected to mirror 305 and is controlled by a wavelength-stability controller 332, which causes traducer 330 to adjust mirror 305 to maintain resonance of fundamental beam 322 within external cavity 310. At such resonance, the intensity of input beam 302 reflected from mirror 304 is minimized. A detector 336 measures the intensity of the reflected beam 335 and sends a signal 337 indicative of the intensity to stability controller 332, which causes transducer 330 to adjust mirror 305 to minimize the intensity of reflected beam 335. In other embodiment, the cavity length of external cavity 310 can be stabilized for resonance by adjusting a cavity mirror to optimize the intensity of frequency-doubled output beam 340b. Alternatively, the cavity mirror can be adjusted to minimize the polarization ellipticity in a superposition beam formed by overlapping pump light reflected from the coupling mirror and resonant light leaked through the coupling mirror. Such an arrangement is described in, e.g., A. P. Williams et al. (*NASA Tech Briefs*, p. 56–57, January 1995) and J. C. Baumert et al. (*Appl. Opt.* 24:1299–1301, 1985).

All of the embodiments described above can be supported on breadboard, rod systems, or mounting structures built from low temperature expansion materials such INVAR™ or Super INVAR™, which are based on an iron nickel steel alloy, or ZERODUR™, which is a low expansion glass. Also, optical surfaces can be protected from the ambient environment by surrounding the beam paths with flexible polymer tubing. Furthermore, because many nonlinear crystals are hydroscopic, a dry purge gas such as nitrogen or other drying agent can be used to surround the nonlinear crystal. Alternatively, the entire laser light source can be enclosed and positive pressure from a purge gas can fill the system to prevent dust and moisture. Finally, the entire laser light source can be contained in a temperature-controlled environment to prevent thermally induced fluctuations in the two harmonically related, single-frequency output beams.

Figure 4A:
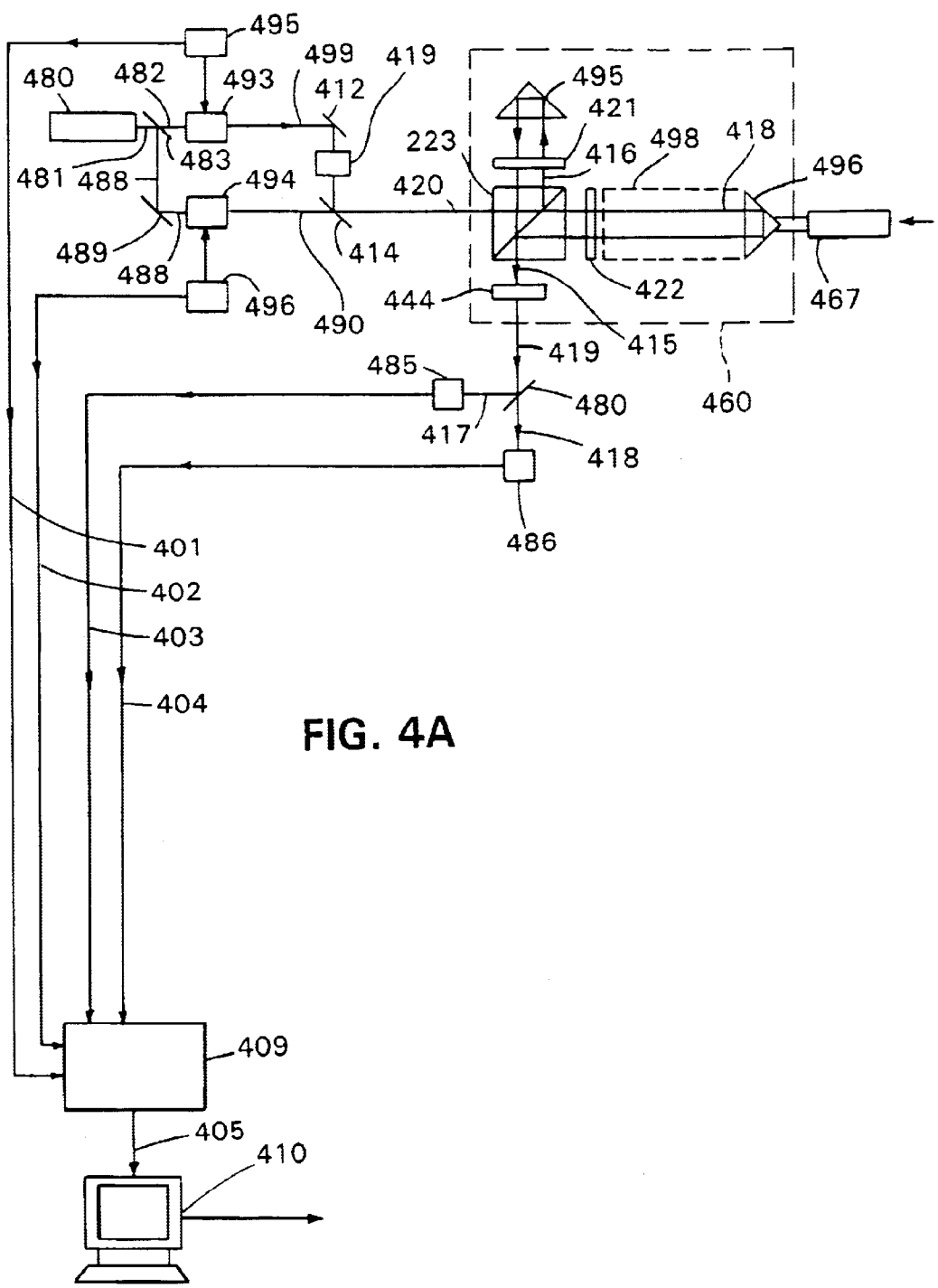
FIGS. 4a and 4b are schematic diagrams relating to an interferometry system that measures both dispersion and displacement using the Helium-Neon light source in either FIG. 1 or 3.

The Helium-Neon laser light source described above with reference to FIGS. 1 and 3 can be used as the light source for a displacement and dispersion measuring interferometer as shown in the schematic diagram of FIG. 4a. A Helium-Neon laser light source 480 such as that in FIG. 1 or FIG. 3 generates a light beam 481 that is a coextensive superposition of two harmonically related, single-frequency beams at wavelengths $\lambda_1$, e.g., 632.8 nm, and $\lambda_2$, e.g., 316.4 nm. The ratio of the wavelengths ($\lambda_1/\lambda_2$) has a known value that can be expressed, at least approximately, as $l_1/l_2$ where $l_1$ and $l_2$ are integers. A dichroic beam splitter 483 splits superposed beam 481 into two single-wavelength beams 482 and 488, beam 482 at wavelength $\lambda_1$ and beam 488 at $\lambda_2$. Beam 482 passes through a first acousto-optical modulation system 493 powered by driver 495 to become beam 499. Similarly, beam 488, after being redirected by mirror 489, passes through a second acousto-optical modulation system 494 powered by driver 494 to become beam 490. Acousto-optical modulation systems 493 and 494 each produce a frequency splitting between orthogonal linear polarization components of beams 499 and 490, respectively.

In particular, acousto-optical modulation system 493 shifts the optical frequency of the x-polarization component of beam 482 by an amount $f_1$ with respect to its y-polarization component to produce beam 499. Similarly, acousto-optical modulation system 494 shifts the optical frequency of the x-polarization component of beam 488 by an amount $f_2$ with respect to its y-polarization component to produce beam 490. In this description, the z-axis is collinear with the propagation direction of the beam, the x-axis is in the plane of FIG. 4a perpendicular to the z-axis, and the y-axis is perpendicular to the plane of FIG. 4a. The values of the frequency shifts $f_1$ and $f_2$ are determined by drivers 495 and 494, respectively, and are many orders of magnitudes smaller (e.g., about $10^{-7}$ smaller) than the optical frequencies defined by $\lambda_1$ and $\lambda_2$. Acousto-optical modulation systems 493 and 494 each include at least one acousto-optical modulator and one or more additional optical elements such as a prism and a birefringent element. Suitable acousto-optical modulation systems are described by G. E. Sommargren in U.S. Pat. Nos. 4,684,828 and 4,687,958, and by H. A. Hill in U.S. patent application Ser. No. 09/061,928 filed Apr. 17, 1998, the contents of all of which are incorporated herein by reference. The frequency splittings produced by the acousto-optical modulation systems permit the use of heterodyne interferometry techniques. Other frequency splitting techniques known in the art can also be used to produce heterodyne frequency splittings. Furthermore, the Helium-Neon laser light source can be used with dispersion interferometers that use homodyne interferometry techniques in which case the frequency splittings are not necessary.

In some embodiments, either or both of acousto-optical modulation systems 493 and 494 can additionally introduce a frequency offset to both polarization components of beams 482 and 488, respectively. For example, acoustooptical modulation system 493 can shift the x-polarization component of beam 482 by $f_0$ and its y-polarization component by $f_0+f_1$, and acousto-optical modulation system 494 can shift the x-polarization component of beam 488 by $f_0'$ and its y-polarization component by $f_0'+f_2$. The frequency offsets can improve isolation between source 480 and the interferometer downstream.

Beam 499 is directed by mirror 412 to dichroic beam splitter 414, which combines beams 499 and beam 490 into beam 420. Beam 420 thus comprises frequency-shifted orthogonal polarization components at $\lambda_1$ and frequency-shifted orthogonal polarization components at $\lambda_2$, all of which are substantially coextensive and collinear. Beam-shaping optics 410 modify the transverse spatial profile of beam 499 so that the components of beam 420 at $\lambda_1$ have similar diameters and, more particularly, similar transverse intensity profiles as those of the components of beam 420 at $\lambda_2$. In other embodiments, beam-shaping optics 410 can be positioned either before or after the acousto-optical modulation systems and can vary the beam at $\lambda_1$ or the beam at $\lambda_2$ where ever they are separated from one another. Suitable beam-shaping optics include, for example, beam expanders, beam compressors, variable density filters, and apodizing masks. Such elements can be used separately or in combination to produce the similar transverse intensity profiles.

Beam 420 is directed to an interferometer 460 that includes a polarizing beam splitter 423, a reference retroreflector 495, a measurement retroreflector 496 connected to a movable measurement object 467, a polarizer 444, and quarter-wave plates 421 and 422. Polarizing beam splitter 423 splits beam 420 into a reference beam 416 including y-polarized components at wavelengths $\lambda_1$ and $\lambda_2$, and a measurement beam 418 including x-polarized components at wavelengths $\lambda_1$ and $\lambda_2$. Polarizing beam splitter 423 directs reference beam 416 to retroreflector 495, which redirects beam 416 back to the beam splitter 423 whereupon its components at wavelengths $\lambda_1$ and $\lambda_2$ are now x-polarized because of their two passes through quarter-wave plate 421. Similarly, polarizing beam splitter 423 directs measurement beam 418 to retroreflector 496, which redirects beam 418 back to the beam splitter 423 whereupon its components at wavelengths $\lambda_1$ and $\lambda_2$ are now y-polarized because of their two passes through quarter-wave plate 422. Polarizing beams splitter 423 then recombines redirected beams 416 and 418 to form exit beam 415.

Between polarizing beam splitter 423 and retroreflector 496, measurement beam 418 passes through gas 498 whose refractive index affects the total optical path length traversed by measurement beam 418.

Because of the separate reference and measurement paths, interferometer 460 introduces a phase shift $\phi_1$ between the x-polarized and y-polarized components of exit beam 415 at wavelength $\lambda_1$ and introduces a phase shift $\phi_2$ between the x-polarized and y-polarized components of exit beam 415 at wavelength $\lambda_2$. An expression for the phase shifts is given by:

$$\phi_j = Lpk_j n_j + \zeta_j, \text{ where } j=1 \text{ or } 2 \quad (1)$$

where L is the round trip distance traversed by measurement beam 418, p is the number of round-trip passes in the interferometer (p=1 for the presently described interferometer), $n_j$ is the average refractive index of gas 498 at wavenumber $k_j=(2\pi)/\lambda_j$, and $\zeta_j$ is a phase-offset for wavelength $\lambda_j$, which includes all contributions to the phase shifts $\phi_j$ that are not related to the path traversed by measurement beam 418. Because the components of measurement beam 418 at wavelengths $\lambda_1$ and $\lambda_2$ traverse the same geometric distance L but experience different refractive indices $n_1$ and $n_2$, the phases $\phi_j$ can be used to determine dispersion in gas 498.

Polarizer 444 (oriented, e.g., at 45 degrees to the plane of the FIG. 3a) mixes the x-and y-polarization components of exit beam 415 at each of wavelengths $\lambda_1$ and $\lambda_2$ to produce a mixed beam 419. A dichroic beam splitter 480 then separates mixed beam 419 into a first signal beam 417 at wavelength $\lambda_1$ and a second signal beam 418 at wavelength $\lambda_2$. Photoelectric detectors 485 and 486 measure the time-varying intensities of signal beams 417 and 418, respectively, to produce interference, heterodyne signals $s_1$ and $s_2$, respectively. The signals $s_j$ have the form $$s_j = A_j \cos[\alpha_j(t)], j=1 \text{ and } 2 \quad (2)$$

where the time-dependent arguments $\alpha_j(t)$ are given by $$\alpha_j(t) = 2\pi f_j t + \phi_j, j=1 \text{ and } 2 \quad (3)$$

Heterodyne signals $s_1$ and $s_2$ are transmitted to processing system 409 for analysis as electronic signals 403 and 404, respectively, in either digital or analog format. Processing system 409 also receives electronic signals 401 and 402 from drivers 495 and 496, respectively, indicative of their respective driving frequencies (e.g., heterodyne split frequencies $f_1$ and $f_2$) and phases.

Figure 4B:
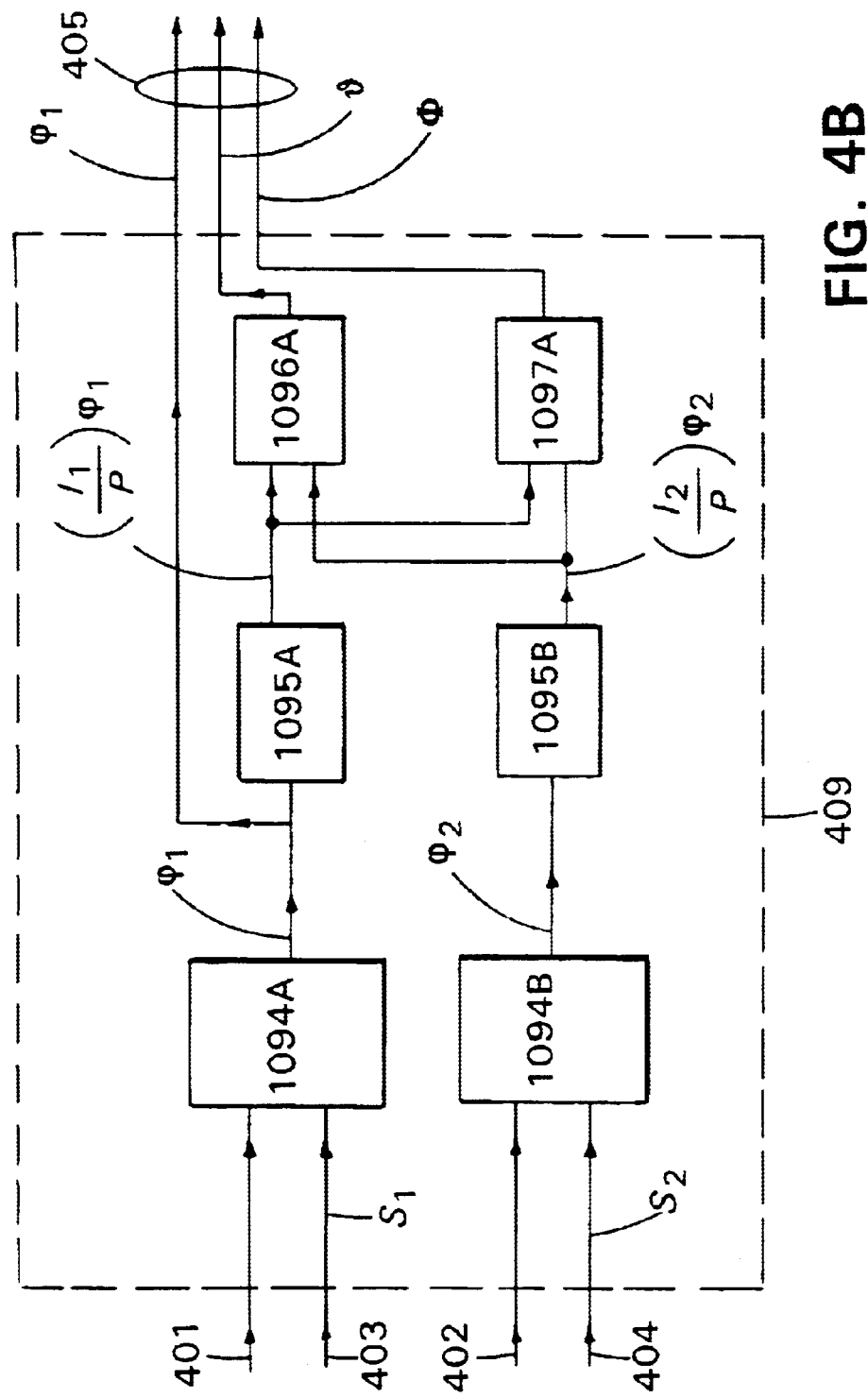

Referring to FIG. 4b, processing system 409 further includes electronic processors 1094A and 1094B to determine the phases $\phi_1$ and $\phi_2$, respectively. Processor 1094A determines $\phi_1$ based on signal 403 ($s_1$) and signal 401 (heterodyne reference phase at $f_1$ for driver 495), and processor 1094B determines $\phi_2$ based on signal 404 ($s_2$) and signal 402 (heterodyne reference phase at $f_2$ for driver 496). The processors can use either digital or analog signal processing techniques, including, e.g., time-based phase detection such as a digital Hilbert transform phase detector. See, e.g., section 4.1.1 of R. E. Best, "Phase-locked loops: theory, design, and applications" 2nd ed. (McGraw-Hill New York, 1993). In other embodiments, signals 401 and 402 can be derived from mixed reference phase beams produced by mixing the polarization components of a portion of each of beams 499 and 490, respectively.

Phases $\phi_1$ and $\phi_2$ determined by processors 1094A and 1094B are next multiplied by $l_1/p$ and $l_2/p$, respectively, in electronic processors 1095A and 1095B, respectively, preferably by digital processing, resulting in phases $(l_1/p)\phi_1$ and $(l_2/P)\phi_2$, respectively. The phases $(l_1/p)\phi_1$ and $(l_2/P)\phi_2$ are next added together in electronic processor 1096A and subtracted one from the other in electronic processor 1097A, preferably by digital processes, to create the phases $\Theta$ and $\Phi$, respectively. Formally, $$\vartheta = \left(\frac{l_1}{p}\varphi_1 + \frac{l_2}{p}\varphi_2\right) \quad (4)$$

$$\Phi = \left(\frac{l_1}{p}\varphi_1 - \frac{l_2}{p}\varphi_2\right) \quad (5)$$

Referring again to FIG. 4a, the phases $\phi_1$, $\Theta$, and $\Phi$ are transmitted to computer 410 as signal 405, in either digital or analog format.

For a measuring path comprised of a vacuum, phase $\Phi$ should substantially be a constant independent of Doppler shifts due to a motion of retroreflector 496. This may not be the case in practice due to differences in the group delay experienced by the electrical signals $s_1$ and $s_2$. Group delay, often called envelope delay, describes the delay of a packet of frequencies and the group delay at a particular frequency is defined as the negative of the slope of the phase curve at the particular frequency [see H. J. Blinchikoff and A. J. Zverev, *Filtering in the Time and Frequency Domains*, Section 2.6, 1976 (Wiley, New York)]. If phase $\Phi$ is not a constant for a measuring path comprised of a vacuum, techniques known to those skilled in the art can be used to compensate for departures of phase $\Phi$ from a constant (c.f. Blinchikoff and Zveriv, ibid.). It is important to note that the group delay effects in $\Phi$ can not only be detected but can also be determined by measuring $\Phi$ as a function of different translational velocities of retroreflector 496 produced by movable measurement object 467 for a measuring path comprising a vacuum. In many cases the group delay effects in $\Phi$ can be significantly reduced by performing analog-to-digital conversion of signals $s_1$ and $s_2$ as close as practical to the photoelectric detectors in detectors 485 and 486, respectively.

The refractivity of the gas, $(n_1-1)$, can be calculated using the formula $$n_1 - 1 = \frac{\Gamma}{\chi L[1-(K/\chi)^2]}\{[\vartheta(K/\chi) - \Phi] - Q\} \quad (6)$$

where $$\chi = (l_1k_1 + l_2k_2)/2 \quad (7)$$

$$K = (l_1k_1 - l_2k_2)/2 \quad (8)$$

$$\Gamma = \frac{n_1 - 1}{n_2 - n_1} \quad (9)$$

the quantity $\Gamma$ being the reciprocal dispersive power of the gas which is substantially independent of environmental conditions and turbulence in the gas. The offset term $Q$ is defined as $$Q = \xi(K/\chi) - Z \quad (10)$$

where $$\xi = \left(\frac{l_1}{p}\zeta_1 + \frac{l_2}{p}\zeta_2\right) \quad (11)$$

$$Z = \left(\frac{l_1}{p}\zeta_1 - \frac{l_2}{p}\zeta_2\right) \quad (12)$$

Values of $\Gamma$ may be computed from knowledge of the gas composition and from knowledge of the wavelength dependent refractivities of the gas constituents. For example, for the wavelengths $\lambda_1$ equal to 632.8 nm and $\lambda_2$ equal to 316.4 nm, $\Gamma$ equals about 21.4.

For those applications related to displacement measuring interferometry, the heterodyne phase $\phi_1$ and phases $\Theta$ and $\Phi$ may be used to determine the geometric distance L, independent of the effects of the refractive index of gas 498 in the measurement path, using the formula:

$$L = \frac{1}{(\chi + K)}\left\{\frac{l_1}{p}(\varphi_1 - \zeta_1) - \frac{\Gamma}{[1-(K/\chi)]}[(K/\chi)\vartheta - \Phi - Q]\right\} \quad (13)$$

The ratio of the wavelengths can be expressed in terms of $(K/\chi)$ from Eqs. (7) and (8) with the result $$\frac{\lambda_1}{\lambda_2} = \left(\frac{l_1}{l_2}\right)\left[\frac{1-(K/\chi)}{1+(K/\chi)}\right] \quad (14)$$

When operating under the condition $$|K/\chi| \ll \frac{(n_2 - n_1)}{(n_2 + n_1)} \quad (15)$$

the ratio of the phases $\Phi$ and $\Theta$ has the approximate value $$(\Phi/\vartheta) \cong \frac{(n_2 - n_1)}{(n_2 + n_1)} \quad (16)$$

Where $\epsilon$ is the relative precision desired for the measurement of the refractivity of the gas or of the change in the optical path length of the measurement leg due to the gas, and the following inequality applies:

$$\left|\frac{\lambda_1}{\lambda_2} - \frac{l_1}{l_2}\right| \ll \left(\frac{l_1}{l_2}\right)(n_2 - n_1)\varepsilon \quad (17)$$

Eqs. (6) and (13) reduce to more simple forms of $$n_1 - 1 = -\frac{\Gamma}{\chi L}(\Phi + Q) \quad (18)$$

$$L = \frac{1}{\chi}\left[\frac{l_1}{p}(\varphi_1 - \zeta_1) + \Gamma(\Phi + Q)\right] \quad (19)$$

respectively. Using the equations above, computer 410 calculates $(n_1-1)$, L, and/or changes in L based on signal 405 from processing system 409. Similar calculations for L can also be performed with respect to $n_2$.

The presently described embodiment employs a single-pass Michelson interferometer as interferometer 460 to permit the dispersion measurement, but in other embodiments other interferometers known in the art can also be used with either single or multiple passes and in either similar or different configurations. For example, it is not necessary that components at wavelengths $\lambda_1$ and $\lambda_2$ be coextensive upon entering the interferometer, only that the components at wavelengths $\lambda_1$ and $\lambda_2$ be coextensive in the region of gas 498 where dispersion is to be measured. Furthermore, other embodiments of the interferometry system can employ other processing techniques known in the art that determine dispersion, refractivity, and changes in the geometric distance to the measurement object based on phases $\phi_1$ and $\phi_2$.

The interferometry systems using any of the Helium-Neon laser light sources of the present invention described above can characterize air turbulence (i.e., changes in refractivity) and use the characterized air turbulence to correct distance measurements. As a result, such interferometry system using such Helium-Neon laser light sources provide highly accurate measurements. Such systems can be especially useful in lithography applications used in fabricating large-scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997).

Overlay depends directly on the performance, i.e. accuracy and precision, of the distance measuring interferometers used to position the wafer and reticle (or mask) stages. Since a lithography tool may produce $50–100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation The reticle is also referred to as a mask, and these terns are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R Sheats and B. W. Smith, in *Microlithography: Science and Technology* (Marcel Dekker, Inc., New York, 1998), the contents of which is incorporated herein by reference.

Interferometry systems using the Helium-Neon laser fight sources described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object. More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 5A:
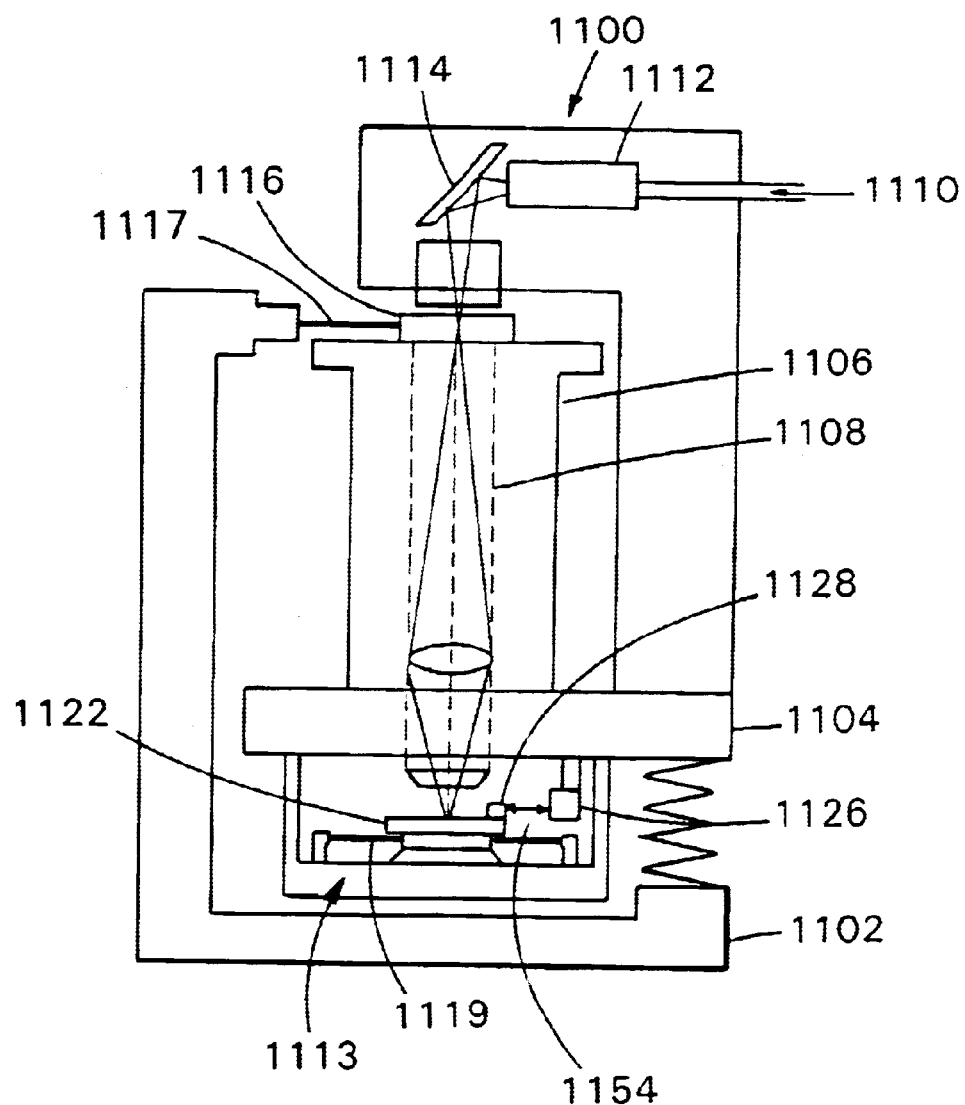

An example of a lithography scanner 1100 using an interferometry system 1126 using the laser of the present invention is shown in FIG. 5*a*. The interferometry system using any of the Helium-Neon laser light sources described above is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126 using the laser of the present invention. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems using a Helium-Neon laser light source described above can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produced by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than scanners.

Figure 5B:
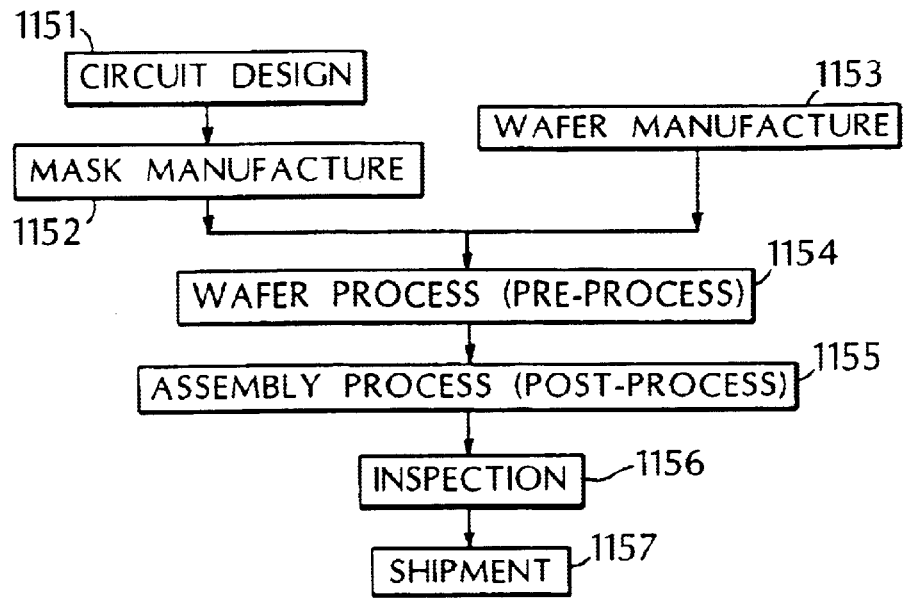

As is well known in the art, lithography is a critical part of manufacturing methods for making semiconducting devices. For example, U.S. Pat. No. 5,483,343 outlines steps for such manufacturing methods. These steps are described below with reference to FIGS. 5b and 5c. FIG. 5b is a flow chart of the sequence of manufacturing a semiconductor device such as a semiconductor chip (e.g. IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems using any of the Helium-Neon laser light sources described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 5C:
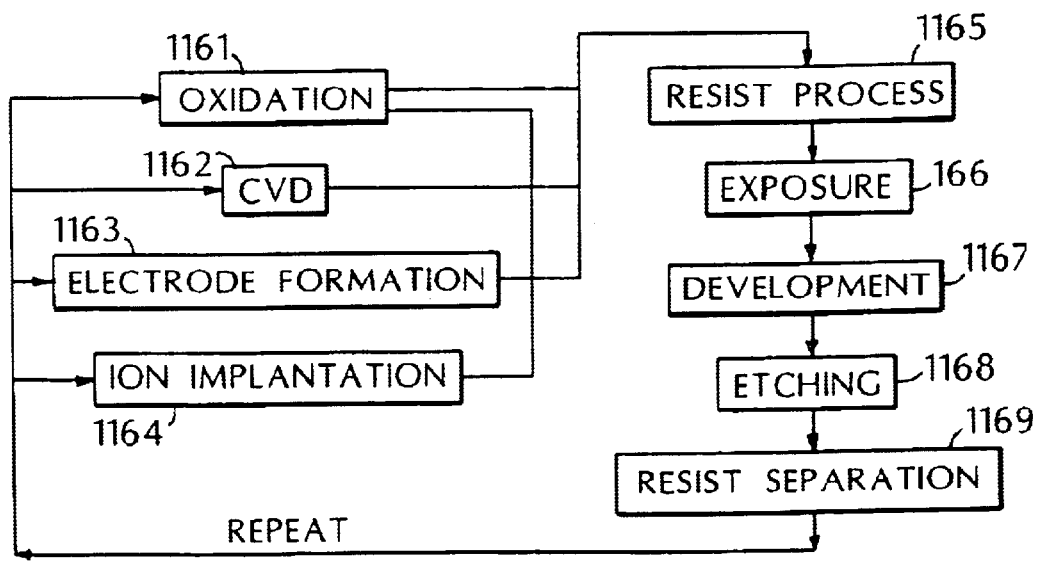

FIG. 5c is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems using any of the light sources described herein can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems described herein can be used to measure the relative movement between the substrate and write beam.

Figure 6:
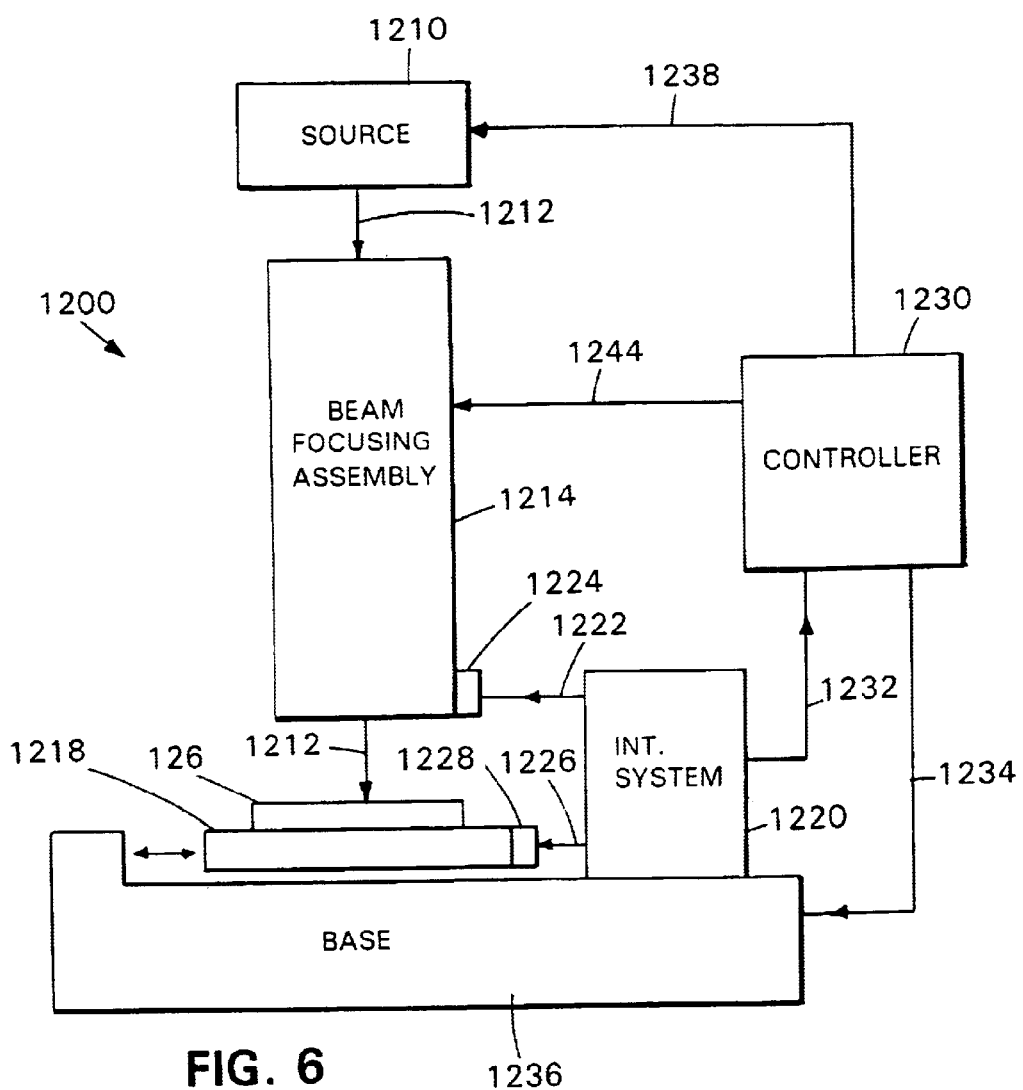

As an example, a schematic of a beam writing system 1200 is shown in FIG. 6. A source 1210 generates a write beam 1212, and a beam focusing assembly 1214 directs the radiation beam to a substrate 1216 supported by a movable stage 1218. To determine the relative position of the stage, an interferometry system 1220 using any of the Helium-Neon laser light sources described herein directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Changes in the position measured by interferometry system 1220 correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g. using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

Other aspects, advantages, and modifications are within the scope of the following claims.

What is claimed is:

1. A laser light source comprising:
   a Helium-Neon gain medium;
   a power source electrically coupled to the gain medium which during operation causes the gain medium to emit optical radiation at a first wavelength;
   a nonlinear optical crystal which during operation converts a portion of the optical radiation at the first wavelength into optical radiation at a second wavelength that is a harmonic of the first wavelength;
   an etalon; and
   at least two cavity mirrors enclosing the gain medium, the non-linear optical crystal, and the etalon to define a laser cavity, wherein during operation the etalon causes the cavity to lase at a single axial mode, and wherein at least one of the cavity mirrors couples the optical radiation at the first and second wavelengths into two harmonically related, single-frequency, output beams at the first and second wavelengths.

2. The laser light source of claim 1, wherein the two harmonically related, single-frequency, output beams are coextensive.

3. The laser light source of claim 1 further comprising a birefringent filter positioned within the cavity and oriented to select a particular Helium-Neon laser transition.

4. The laser light source of claim 1 further comprising a heating element thermally coupled to the crystal and a temperature controller that causes the heating element to maintain a crystal temperature suitable for noncritical phase matching of the optical radiation at the first and second wavelengths.

5. The laser light source of claim 4, wherein the nonlinear optical crystal is Rubidium Dihydrogen Phosphate (RDP).

6. The laser light source of claim 4, wherein the non-linear optical crystal has an optic axis oriented substantially perpendicular to the propagation direction of the optical radiation within the crystal.

7. The laser light source of claim 1, wherein the nonlinear crystal is oriented for critical phase matching of the optical radiation at the first and second wavelengths.

8. The laser light source of claim 7, wherein the nonlinear crystal is one of Lithium Triborate (LBO), Beta-Barium Borate (BBO), or Lithium Iodate (LiIO$_3$).

9. The laser light source of claim 1, wherein the optical radiation propagates through front and back faces of the nonlinear optical crystal and wherein the front and back faces of the crystal are parallel to one another to within 1 mrad.

10. The laser light source of claim 1 wherein the at least two cavity mirrors comprise two end mirrors and at least one fold mirror.

11. The laser light source of claim 10 wherein the at least one fold mirror has a coating that is less than 4% reflective at 3.39 microns.

12. The laser light source of claim 1, wherein the intensity of each output beam is greater than about 0.5 mW.

13. The laser light source of claim 1 further comprising a transducer coupled to one of the cavity mirrors and a wavelength controller which during operation causes the transducer to adjust the cavity length of the laser cavity based on a wavelength stabilization signal derived from one of the output beams.

14. The laser light source of claim 1 further comprising a detector and an intensity controller, wherein during operation the detector measures an intensity of a portion of the output beam at the first wavelength and sends an intensity stabilization signal to the intensity controller indicative of the intensity of the output beam at the first wavelength, and wherein during operation the intensity controller causes the power source to adjust current flow through the gain medium based on the intensity stabilization signal.

15. The laser light source of claim 1, wherein the Helium-Neon gain medium comprises a vacuum tube filled with Helium and Neon gases, the tube having opposite ends with a Brewster window at one end and a bellows hermetically sealing the other end to one the cavity mirrors.

16. The laser light source of claim 1, wherein the Helium-Neon gain medium comprises multiple vacuum tubes each filled with Helium and Neon gases and multiple fold mirrors folding the multiple tubes into the laser cavity.

17. The laser light source of claim 1, wherein the Helium-Neon gain medium comprises an enclosure of Helium and Neon gases, the enclosure having an elongate cross-section and being surrounded at opposite ends by mirrors that define multiple passes through the enclosure within the laser cavity.

18. The laser light source of claim 1 further comprising first and second acousto-optical modulation systems positioned external to the laser cavity, wherein during operation the first modulation system generates a frequency splitting between orthogonal polarization components of the output beam at the first wavelength and the second modulation system generates a frequency splitting between orthogonal polarization components of the output beam at the second wavelength.

19. An interferometry system comprising:
    the laser light source of claim 1; and
    a dispersion interferometer which during operation measures dispersion along a path to a measurement object using light derived from the two output beams.

20. An interferometry system comprising:
    the laser light source of claim 1;
    an interferometer which during operation directs first and second measurement beams along a common path contacting a reflective measurement object and combines the reflected first measurement beam with a first reference beam to form a first exit beam and the reflected second measurement beam with a second reference beam to form a second exit beam, the first measurement and reference beams derived from the output beam from the laser light source having the first wavelength and the second measurement and reference beams derived from the output beam from the laser light source having the second wavelength, the first and second exit beams indicative of changes in the optical path length to the measurement object at the first and second wavelengths; and an optical analysis system which during operation determines changes in the geometric path length to the measurement object based on the first and second exit beams.

21. A laser light source comprising:

a single-mode Helium-Neon laser which during operation generates a single-frequency input beam at a first wavelength;

a nonlinear optical crystal external to the laser which during operation converts a portion of the input beam at the first wavelength into optical radiation at a second wavelength that is a harmonic of the first wavelength; and a plurality of mirrors enclosing the nonlinear crystal to define a resonant external cavity, wherein one of the mirrors couples optical radiation at the first wavelength from the input beam into the external cavity and another one of the mirrors couples optical radiation at the first and second wavelengths out of the external cavity to produce two harmonically related, single-frequency, output beams at the first and second wavelengths.

22. The laser light source of claim 21 further comprising a transducer coupled to one of the minors and a cavity-length controller which during operation causes the transducer to adjust the cavity length of the external cavity to resonate at the first wavelength.

23. The laser light source of claim 22, wherein the cavity-length controller causes the transducer to adjust the cavity length based on an error signal derived from input beam light not coupled into the external cavity.

24. The laser light source of claim 21, wherein the two harmonically related, single-frequency, output beams are coextensive.

25. The laser light source of claim 21 further comprising a heating element thermally coupled to the crystal and a temperature controller that causes the heating element to maintain a crystal temperature suitable for non-critical phase matching of the optical radiation at the first and second wavelengths.

26. The laser light source of claim 25, wherein the nonlinear optical crystal is Rubidium Dihydrogen Phosphate (RDP).

27. The laser light source of claim 25, wherein the non-linear optical crystal has an optic axis oriented substantially perpendicular to the propagation direction of the optical radiation within the crystal.

28. The laser light source of claim 21, wherein the nonlinear crystal is oriented for critical phase matching of the optical radiation at the first and second wavelengths.

29. The laser light source of claim 28, wherein the nonlinear crystal is one of Lithium Triborate (LBO), Beta-Barium Borate (BBO), or Lithium Iodate ($LiIO_3$).

30. The laser light source of claim 21, wherein the intensity of each output beam is greater than about 0.5 mW.

31. The laser light source of claim 21 further comprising first and second acousto-optical modulation systems positioned external to the external cavity, wherein during operation the first modulation system generates a frequency splitting between orthogonal polarization components of the output beam at the first wavelength and the second modulation system generates a frequency splitting between orthogonal polarization components of the output beam at the second wavelength.

32. An interferometry system comprising:
the laser light source of claim 21; and
a dispersion interferometer which during operation measures dispersion along a path to a measurement object using light derived from the two output beams.

33. An interferometry system comprising:
the laser light source of claim 21;
an interferometer which during operation directs first and second measurement beams along a common path contacting a reflective measurement object and combines the reflected first measurement beam with a first reference beam to form a first exit beam and the reflected second measurement beam with a second reference beam to form a second exit beam, the first measurement and reference beams derived from the output beam from the laser light source having the first wavelength and the second measurement and reference beams derived from the output beam from the laser light source having the second wavelength, the first and second exit beams indicative of changes in the optical path length to the measurement object at the first and second wavelengths; and
an optical analysis system which during operation determines changes in the geometric path length to the measurement object based on the first and second exit beams.

34. An interferometry system comprising:
a Helium-Neon laser light source that generates two harmonically related, single-frequency output beams; and
a dispersion interferometer which during operation measures dispersion along a path to a measurement object using light derived from the two output beams.

35. An interferometry system comprising:
a Helium-Neon laser light source that generates two harmonically related, single-frequency output beams;
an interferometer which during operation directs first and second measurement beams along a common path contacting a reflective measurement object and combines the reflected first measurement beam with a first reference beam to form a first exit beam and the reflected second measurement beam with a second reference beam to form a second exit beam, the first measurement and reference beams derived from the output beam from the laser light source having the first wavelength and the second measurement and reference beams derived from the output beam from the laser light source having the second wavelength, the first and second exit beams indicative of changes in the optical path length to the measurement object at the first and second wavelengths; and
an optical analysis system which during operation determines changes in the geometric path length to the measurement object based on the first and second exit beams.

36. An interferometry method comprising:
providing two harmonically related, single-frequency output beams from a Helium-Neon laser light source; and
measuring dispersion along a path to a measurement object using light derived from the two output beams.

37. An interferometry method comprising:
providing two harmonically related, single-frequency output beams from a Helium-Neon laser light source; and
interferometrically measuring changes in a geometric path length to a measurement object using light derived from the two output beams.

38. A lithography system for use in fabricating integrated circuits on a wafer, the system comprising:

a stage for supporting the wafer;

an illumination system for imaging spatially patterned radiation onto the wafer;

a positioning system for adjusting the position of the stage relative to the imaged radiation; and the interferometry system of claim 19, 20, 32, 33, 34, or 35 for measuring the position of the stage.

39. A lithography system for use in fabricating integrated circuits on a wafer, the system comprising:

a stage for supporting the wafer; and an illumination system including a radiation source, a mask, a positioning system, a lens assembly, and the interferometry system of claim 19, 20, 32, 33, 34, or 35, wherein during operation the source directs radiation through the mask to produce spatially patterned radiation, the positioning system adjusts the position of the mask relative to the radiation from the source, the lens assembly images the spatially patterned radiation onto the wafer, and the interferometry system measures the position of the mask relative to the radiation from the source.

40. A lithography system for fabricating integrated circuits comprising first and second components, the first and second components being movable relative to each other, and the interferometry system of claim 19, 20, 32, 33, 34, or 35, wherein the first component comprises the measurement object and the interferometry system measures the position of the first component relative to the second component.

41. A lithography system for fabricating integrated circuits comprising first and second components, the first and second components being movable relative to each other, and the interferometry system of claim 19, 20, 32, 33, 34, or 35, wherein the first component comprises the measurement object, the reference beams contact the second component prior to forming the exit beams, and the interferometry system measures the relative position of the first and second components.

42. A beam writing system for use in fabricating a lithography mask, the system comprising:

a source providing a write beam to pattern a substrate;

a stage supporting the substrate;

a beam directing assembly for delivering the write beam to the substrate;

a positioning system for positioning the stage and beam directing assembly relative one another; and the interferometry system of claim 19, 20, 32, 33, 34, or 35 for measuring the position of the stage relative to the beam directing assembly.

43. A lithography method for use in fabricating integrated circuits on a wafer comprising:

supporting the wafer on a moveable stage;

imaging spatially patterned radiation onto the wafer;

adjusting the position of the stage; and measuring the position of the stage using the interferometry method of claim 36 or 37.

44. A lithography method for use in the fabrication of integrated circuits comprising:

directing input radiation through a mask to produce spatially patterned radiation;

positioning the mask relative to the input radiation;

measuring the position of the mask relative to the input radiation using the interferometry method of claim 36 or 37, wherein one of a stage supporting the mask and a illumination system providing the input radiation includes the measurement object; and imaging the spatially patterned radiation onto a wafer.

45. A lithography method for fabricating integrated circuits on a wafer comprising:

positioning a first component of a lithography system relative to a second component of a lithography system to expose the wafer to spatially patterned radiation; and measuring the position of the first component relative to the second component using the method of claim 36 or 37 wherein the first component includes the measurement object.

46. A beam writing method for use in fabricating a lithography mask, the method comprising:

directing a write beam to a substrate to pattern the substrate;

positioning the substrate relative to the write beam; and measuring the position of the substrate relative to the write beam using the interferometry method of claim 36 or 37.

* * * * *

UNITED STATES PATENT AND TRADEMARK OFFICE
CERTIFICATE OF CORRECTION

| | |
|---|---|
| PATENT NO. | : 6,724,486 B1 |
| APPLICATION NO. | : 09/305808 |
| DATED | : April 20, 2004 |
| INVENTOR(S) | : William A. Shull et al. |

Page 1 of 1

It is certified that error appears in the above-identified patent and that said Letters Patent is hereby corrected as shown below:

<u>Title Pg, Item (56)</u>
References Cited, replace "4,684,828" with --4,984,828--
Other Publications, line 1, replace "frequency" with --Frequency--

<u>Column 24</u>
Claim 15, line 31, insert --of-- after "one"

<u>Column 25</u>
Claim 22, line 27, replace "minors" with --mirrors--

Signed and Sealed this

Twenty-second Day of May, 2007

JON W. DUDAS
*Director of the United States Patent and Trademark Office*